(12) United States Patent
Ito

(10) Patent No.: US 12,142,321 B2
(45) Date of Patent: Nov. 12, 2024

(54) SEMICONDUCTOR STORAGE DEVICE INCLUDING A VOLTAGE DIFFERENCE GENERATION CIRCUIT

(71) Applicant: Kioxia Corporation, Tokyo (JP)

(72) Inventor: Tomohiko Ito, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 156 days.

(21) Appl. No.: 17/818,833

(22) Filed: Aug. 10, 2022

(65) Prior Publication Data

US 2023/0207014 A1  Jun. 29, 2023

(30) Foreign Application Priority Data

Dec. 24, 2021  (JP) .................. 2021-211390

(51) Int. Cl.
*G11C 16/08*  (2006.01)
(52) U.S. Cl.
CPC ................... *G11C 16/08* (2013.01)
(58) Field of Classification Search
None
See application file for complete search history.

(56) References Cited

U.S. PATENT DOCUMENTS

| 4,751,454 A | 6/1988 | Dielacher et al. |
| 6,157,259 A | 12/2000 | Dasgupta |
| 6,268,842 B1 | 7/2001 | Yamazaki et al. |
| 2003/0043686 A1* | 3/2003 | Lee ................. G11C 16/08 365/244 |
| 2003/0133326 A1* | 7/2003 | Hosono .............. G11C 16/0483 365/185.18 |
| 2005/0093613 A1* | 5/2005 | Nazarian ............... G11C 5/145 327/536 |
| 2007/0109862 A1* | 5/2007 | Kim ....................... G11C 8/10 365/185.23 |
| 2012/0155168 A1* | 6/2012 | Kim ....................... G11C 5/14 365/185.23 |
| 2019/0066796 A1* | 2/2019 | Guo .................... G11C 16/0483 |
| 2022/0301630 A1 | 9/2022 | Nakano et al. |
| 2023/0093270 A1 | 3/2023 | Li |

FOREIGN PATENT DOCUMENTS

| JP | 2005-227954 A | 8/2005 |
| JP | 2022-144316 A | 10/2022 |
| JP | 2023-45252 A | 4/2023 |

* cited by examiner

*Primary Examiner* — J. H. Hur
(74) *Attorney, Agent, or Firm* — Oblon, McClelland, Maier & Neustadt, L.L.P.

(57) ABSTRACT

A semiconductor storage device includes a connection transistor that connects a first wiring to a word line, a block decoder that supplies a signal to a gate of the connection transistor, and a voltage generation circuit including a first node from which a first voltage for generating the signal is supplied to the block decoder, a second node from which a second voltage is supplied to the first wiring, and a voltage difference generation circuit connected between the first node and the second node, wherein the voltage difference generation circuit includes diode-connected first and second transistors and a third transistor, each of the diode-connected first and second transistors having a current path connected between the first and second nodes, the third transistor having a first terminal connected to the first node, a gate connected to a gate of the second transistor, and a second terminal connected to the second node.

7 Claims, 16 Drawing Sheets

| Page | DATA | | | | | | | |
|---|---|---|---|---|---|---|---|---|
| Upper | 1 | 1 | 1 | 0 | 0 | 0 | 0 | 1 |
| Middle | 1 | 1 | 0 | 0 | 1 | 1 | 0 | 0 |
| Lower | 1 | 0 | 0 | 0 | 0 | 1 | 1 | 1 |

FIG. 10

| STATE OF VERIFY TARGET \ NUMBER OF LOOPS | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "A" STATE (VrA) | O | O | O | O | O | O | | | | | | | | | | | | | |
| "B" STATE (VrB) | | | O | O | O | O | O | O | | | | | | | | | | | |
| "C" STATE (VrC) | | | | | O | O | O | O | O | O | | | | | | | | | |
| "D" STATE (VrD) | | | | | | | O | O | O | O | O | O | | | | | | | |
| "E" STATE (VrE) | | | | | | | | | O | O | O | O | O | O | | | | | |
| "F" STATE (VrF) | | | | | | | | | | | O | O | O | O | O | O | | | |
| "G" STATE (VrG) | | | | | | | | | | | | | O | O | O | O | O | O | O |

VOLTAGE DIFFERENCE GENERATION CIRCUIT

VOLTAGE DIFFERENCE GENERATION CIRCUIT

SEMICONDUCTOR STORAGE DEVICE INCLUDING A VOLTAGE DIFFERENCE GENERATION CIRCUIT

CROSS-REFERENCE TO RELATED APPLICATION

This application is based upon and claims the benefit of priority from the prior Japanese Patent Application No. 2021-211390 filed in Japan on Dec. 24, 2021, the entire contents of which are incorporated herein by reference.

FIELD

Embodiments described herein relate generally to a semiconductor storage device.

BACKGROUND

In recent years, semiconductor storage devices, such as NAND-type nonvolatile memories, have adopted a three-dimensional structure to miniaturize the semiconductor storage devices and to increase capacity. Such a semiconductor storage device may adopt a configuration which disposes a plurality of physically independent planes in a memory chip.

When a write operation is simultaneously performed on the plurality of planes, there may be a case where the amount of electric current supplied to the respective planes from a voltage generation circuit increases, so that it is necessary to increase the transistor size in the voltage generation circuit as a result.

BRIEF DESCRIPTION OF THE DRAWINGS

FIG. 10 is a view for describing one example of a standard write sequence.

DETAILED DESCRIPTION

A semiconductor storage device of an embodiment includes: a block including a plurality of memory cells; a word line connected to gates of the plurality of memory cells; a plurality of bit lines connected respectively to one ends of the plurality of memory cells; a first wiring; a connection transistor configured to electrically connect the first wiring to the word line based on a signal supplied to a gate of the connection transistor; a block decoder configured to supply the signal to the gate of the connection transistor; and a voltage generation circuit including a first node from which a first voltage for generating the signal is supplied to the block decoder, a second node from which a second voltage is supplied to the first wiring, and a voltage difference generation circuit connected between the first node and the second node, wherein the voltage difference generation circuit includes a first transistor having a first terminal connected to the first node, a gate connected to the first node, and a second terminal, a second transistor having a first terminal connected to the second terminal of the first transistor, a gate connected to the second terminal of the first transistor, and a second terminal connected to the second node, and a third transistor having a first terminal connected to the first node, a gate connected to the gate of the second transistor, and a second terminal connected to the second node.

Hereinafter, embodiments of the present invention will be described in detail with reference to drawings.

(First Embodiment)

A bypass current path is provided to a voltage generation circuit according to the present embodiment in addition to a voltage difference generating current path, and a bypass current source is disposed on the bypass current path, the voltage difference generating current path being formed of current paths of diode-connected transistors, two voltages having a voltage difference being generated at both ends of the voltage difference generating current path. With such a configuration, it is possible to allow electric current at a substantially predetermined ratio to flow through the voltage difference generating current path and the bypass current path. Accordingly, a differential voltage is prevented from being excessively increased while an increase in circuit area of the transistors is suppressed.

(Configuration of Memory System)

Figure 1:
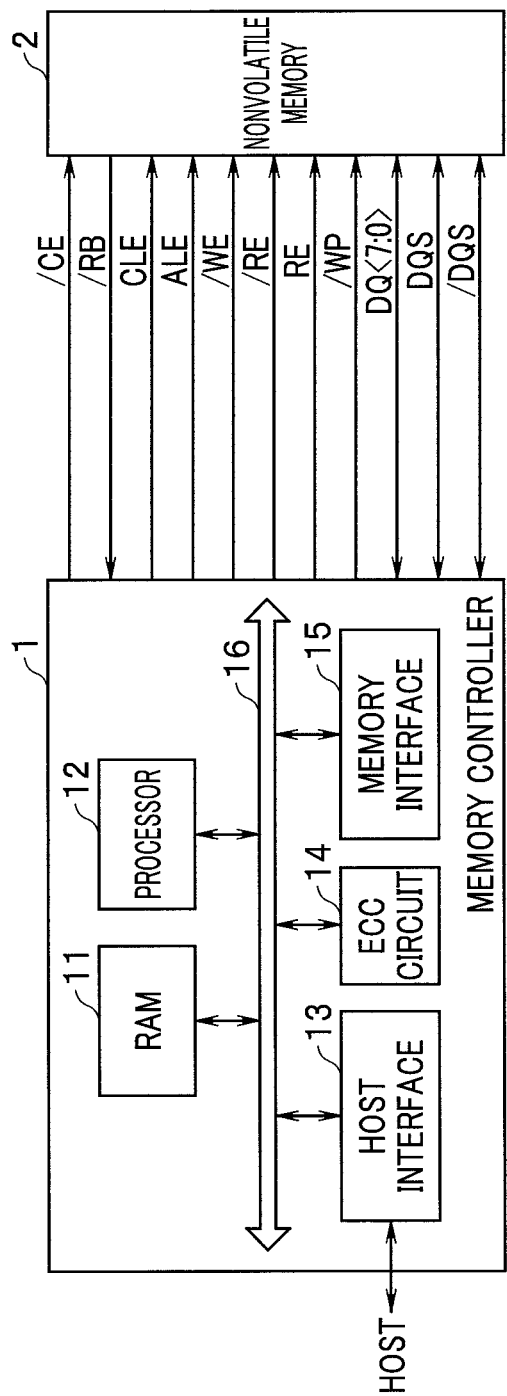
FIG. 1 is a block diagram showing a configuration example of a memory system relating to an embodiment.

FIG. 1 is a block diagram showing a configuration example of a memory system relating to an embodiment. The memory system of the present embodiment includes a memory controller 1 and a nonvolatile memory 2. The memory system can be connected to a host. An example of the host may be electronic equipment, such as a personal computer or a mobile terminal.

The nonvolatile memory 2 is a semiconductor storage device that stores data in a nonvolatile manner, and may be a NAND-type memory, for example. In the present embodiment, the description will be made assuming that the nonvolatile memory 2 is a NAND memory including memory cell transistors each of which can store 3 bits, that is, the nonvolatile memory 2 is a NAND memory having 3 bit/Cell (TLC: triple level cell). However, the nonvolatile memory 2 is not limited to the above. The nonvolatile memory 2 has a three-dimensional structure.

The memory controller 1 controls writing of data to the nonvolatile memory 2 in response to a write request from the host. The memory controller 1 also controls reading of data from the nonvolatile memory 2 in response to a read request from the host. The memory controller 1 includes a RAM (random access memory) 11, a processor 12, a host interface 13, an ECC (error check and correct) circuit 14, and a memory interface 15. The RAM 11, the processor 12, the host interface 13, the ECC circuit 14, and the memory interface 15 are connected to each other by an internal bus 16.

The host interface 13 outputs a request received from the host or the write data being user data, for example, to the internal bus 16. The host interface 13 also transmits user data read from the nonvolatile memory 2, a response from the processor 12, or the like to the host.

The memory interface 15 controls writing processing and reading processing based on an instruction from the processor 12. In the writing processing, user data and the like are written into the nonvolatile memory 2. In the reading processing, user data and the like are read from the nonvolatile memory 2.

The processor 12 centrally controls the memory controller 1. The processor 12 may be a CPU (central processing unit) or an MPU (micro processing unit), for example. When the processor 12 receives a request from the host via the host interface 13, the processor 12 performs control in response to the request. For example, the processor 12 instructs the memory interface 15 to write user data and parity to the nonvolatile memory 2 in response to the request from the host. The processor 12 also instructs the memory interface 15 to read user data and parity from the nonvolatile memory 2 in response to the request from the host.

The processor 12 decides a storage area (hereinafter referred to as "memory area") in the nonvolatile memory 2 for user data accumulated in the RANI 11. User data are stored in the RAM 11 via the internal bus 16. The processor 12 decides the memory area for data in units of a page, being units for writing, that is, the memory area for page data. In the specification, user data stored in one page of the nonvolatile memory 2 are defined as unit data. Unit data are encoded, for example, and are stored in the nonvolatile memory 2 as code words.

The encoding is not always necessary. The memory controller 1 may store unit data in the nonvolatile memory 2 without encoding the unit data. However, as one configuration example, FIG. 1 shows a configuration where encoding is performed. In a case where the memory controller 1 does not perform encoding, page data match unit data. One code word may be generated based on one unit data, or one code word may be generated based on divided data obtained by dividing unit data. Alternatively, one code word may be generated by using a plurality of unit data.

The processor 12 decides the memory area in the nonvolatile memory 2, being a write destination, for each unit data. A physical address is assigned to each memory area in the nonvolatile memory 2. The processor 12 manages the memory area, being a write destination for unit data, by using the physical address. The processor 12 designates the physical address of the decided memory area and instructs the memory interface 15 to write user data to the designated physical address of the nonvolatile memory 2. The processor 12 manages a correspondence between logical addresses of user data (logical addresses managed by the host) and physical addresses. In a case where the processor 12 receives a read request that contains a logical address from the host, the processor 12 identifies the physical address corresponding to the logical address, and instructs the memory interface 15 to read the user data of the identified physical address.

The ECC circuit 14 generates code words by encoding user data stored in the RAM 11. The ECC circuit 14 also decodes a code word read from the nonvolatile memory 2.

The RAM 11 temporarily stores user data received from the host before the user data are stored in the nonvolatile memory 2, or temporarily stores data read from the nonvolatile memory 2 before the data are transmitted to the host. The RAM 11 may be a general-purpose memory, such as an SRAM (static random access memory) or a DRAM (dynamic random access memory).

FIG. 1 shows the configuration example where the memory controller 1 includes the ECC circuit 14 and the memory interface 15. However, the ECC circuit 14 may be incorporated in the memory interface 15. Alternatively, the ECC circuit 14 may be incorporated in the nonvolatile memory 2.

In a case where the memory controller 1 receives a write request from the host, the memory controller 1 is operated as follows. The processor 12 causes write data to be temporarily stored in the RAM 11. The processor 12 reads the data stored in the RAM 11 and inputs the data into the ECC circuit 14. The ECC circuit 14 encodes the inputted data, and supplies the code word to the memory interface 15. The memory interface 15 writes the inputted code word into the nonvolatile memory 2.

In a case where the memory controller 1 receives a read request from the host, the memory controller 1 is operated as follows. The memory interface 15 supplies a code word read from the nonvolatile memory 2 to the ECC circuit 14. The ECC circuit 14 decodes the inputted code word, and stores the decoded data into the RANI 11. The processor 12 transmits the data stored in the RAM 11 to the host via the host interface 13.

(Schematic Configuration of Nonvolatile Memory)

Figure 2:
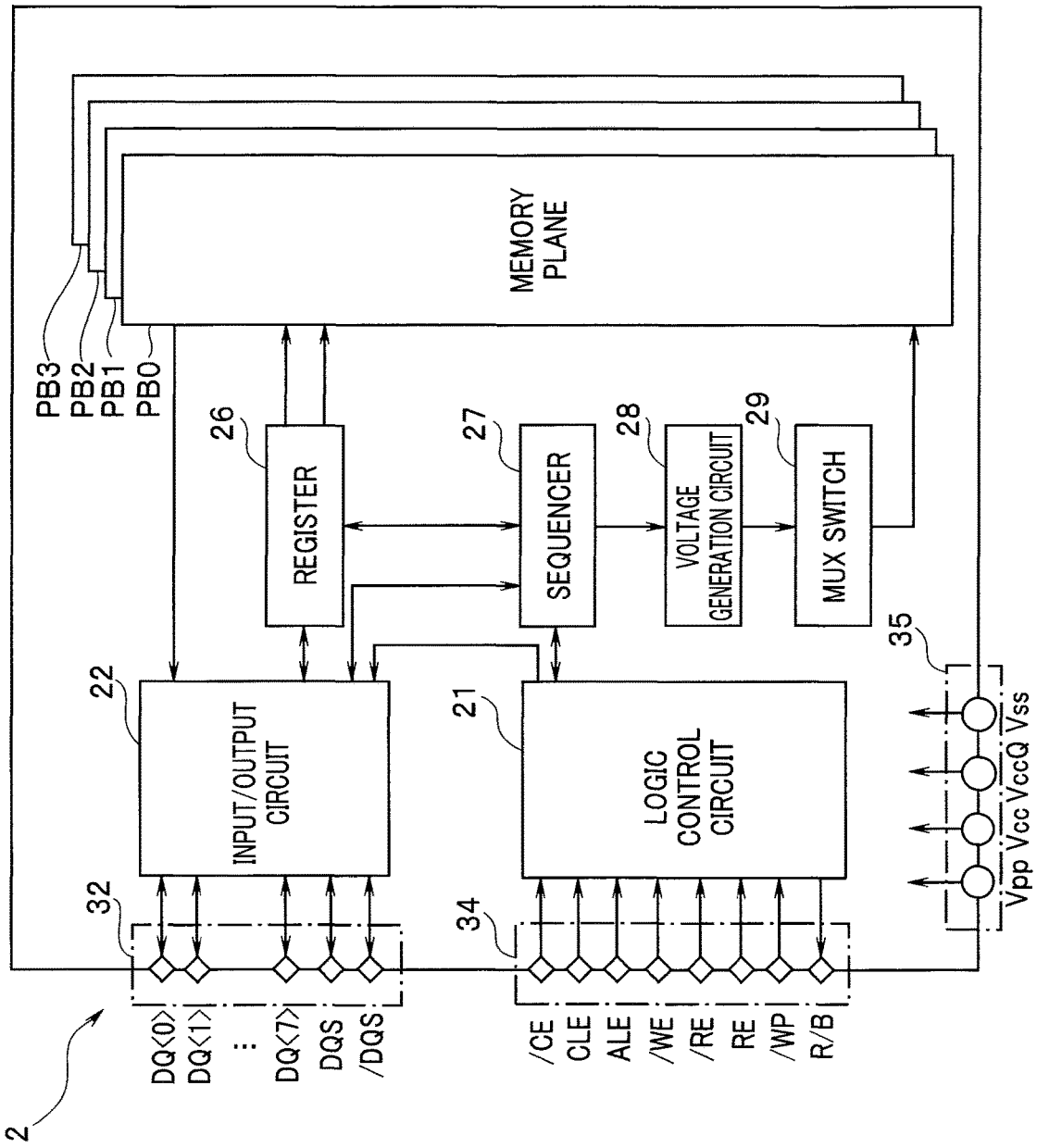
FIG. 2 is a block diagram showing a configuration example of a nonvolatile memory of the present embodiment.
Figure 3:
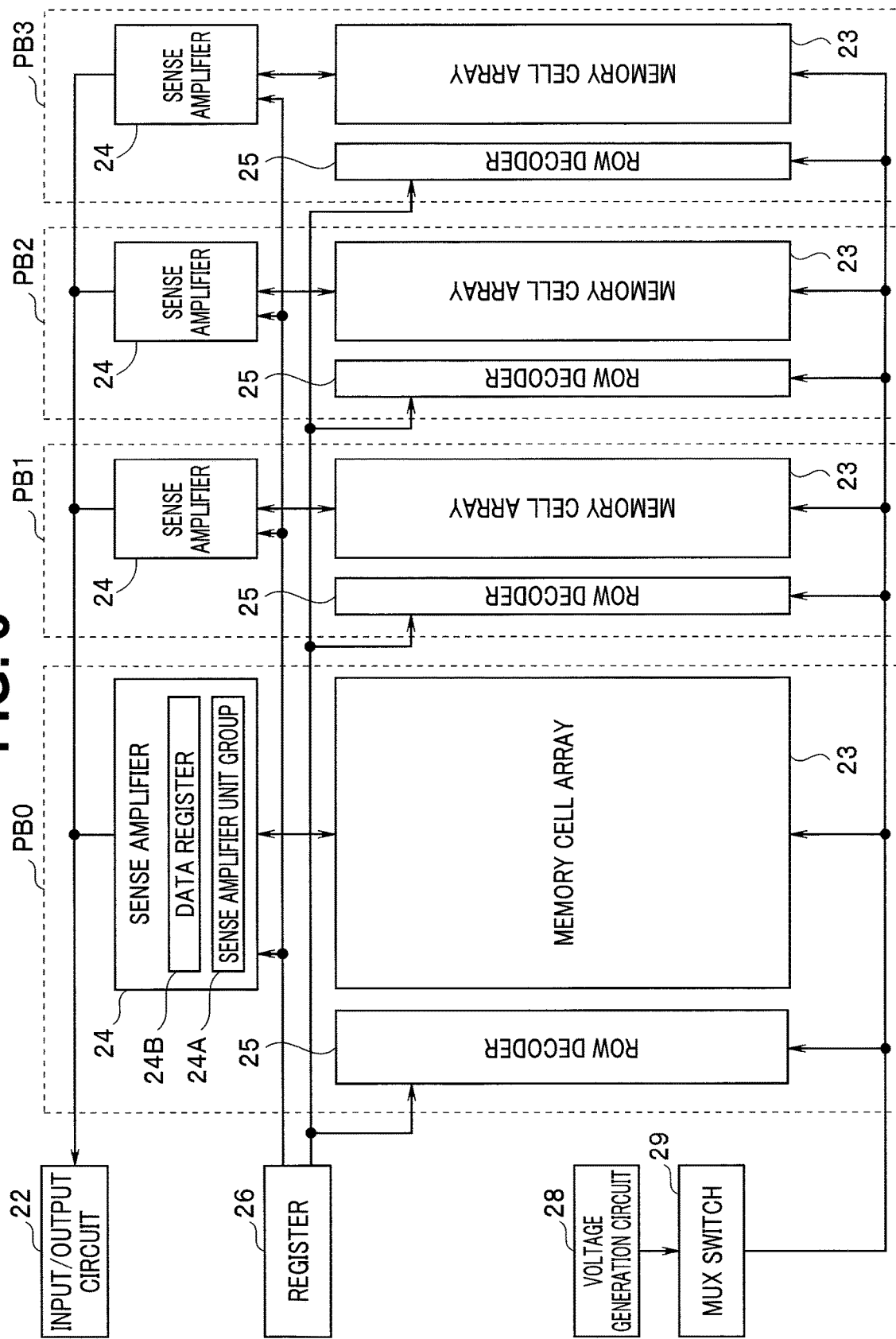
FIG. 3 is a block diagram showing one example of a specific configuration of a plurality of planes shown in FIG. 2.

FIG. 2 is a block diagram showing a configuration example of the nonvolatile memory of the present embodiment. FIG. 3 is a block diagram showing one example of a specific configuration of a plurality of planes shown in FIG. 2.

The nonvolatile memory 2 includes a logic control circuit 21, an input/output circuit 22, a register 26, a sequencer 27, a voltage generation circuit 28, a MUX switch 29, an inputting/outputting pad group 32, a logic controlling pad group 34, a power source inputting terminal group 35, and a plurality of planes PB0, PB1, . . . (hereinafter referred to as "plane PB" when it is unnecessary to differentiate these planes PB0, PB1, . . . ). FIG. 2 shows an example where the number of planes PB is four. However, the number of planes included in the nonvolatile memory 2 is not limited to the above. For example, the number of planes included in the nonvolatile memory 2 may be 2, 3, 8, 16, or the like.

To transmit and receive respective signals that contain data to and from the memory controller 1, the inputting/outputting pad group 32 includes a plurality of terminals (pads) that correspond to signals DQ<7:0> and data strobe signals DQS, /DQS.

To transmit and receive respective signals to and from the memory controller 1, the logic controlling pad group 34 includes a plurality of terminals (pads) that correspond to a chip enable signal /CE, a command latch enable signal CLE, an address latch enable signal ALE, a write enable signal /WE, read enable signals RE, /RE, a write protect signal /WP, and a ready/busy signal R/B.

A signal with the symbol "/" added to the front indicates that the signal is an active low or a negative logic. In other words, a signal without the symbol "/" added to the front becomes active at level "H". In contrast, the signal with the symbol "/" added to the front becomes active at level "L". The signal /CE enables selection of the nonvolatile memory 2. The signal CLE enables a command transmitted as the signal DQ to be latched by a command register. The signal ALE enables an address transmitted as the signal DQ to be latched by an address register. The signal /WE enables writing. The signals RE, /RE enable reading. The signal /WP inhibits writing and erasing. The signal R/B indicates whether the nonvolatile memory 2 is in a ready state (a state where the nonvolatile memory 2 can receive a command from the outside) or a busy state (a state where the nonvolatile memory 2 cannot receive a command from the outside). The memory controller 1 can know the state of the nonvolatile memory 2 by receiving a signal R/B.

To supply various operation power sources to the nonvolatile memory 2 from the outside, the power source inputting terminal group 35 includes a plurality of terminals through which power source voltages Vcc, VccQ, Vpp and a ground voltage Vss are inputted. The power source voltage Vcc is a circuit power source voltage generally applied from the outside as an operation power source, and is a voltage of approximately 3.3 V, for example. The power source voltage VccQ is a voltage of 1.2 V, for example. The power source voltage VccQ is used when a signal is transmitted/received between the memory controller 1 and the nonvolatile memory 2. The power source voltage Vpp is a power source voltage higher than the power source voltage Vcc, and is a voltage of 12 V, for example.

The logic control circuit 21 and the input/output circuit 22 are connected to the memory controller 1 via a NAND bus. The input/output circuit 22 transmits/receives signals DQ (for example, DQ0 to DQ7) to/from the memory controller 1 via the NAND bus.

The logic control circuit 21 receives external control signals (for example, the chip enable signal /CE, the command latch enable signal CLE, the address latch enable signal ALE, the write enable signal /WE, the read enable signals RE, /RE, and the write protect signal /WP) from the memory controller 1 via the NAND bus. The logic control circuit 21 transmits the ready/busy signal RB to the memory controller 1 via the NAND bus.

The register 26 includes a command register, an address register, a status register, and the like. The command register temporarily latches a command. The address register temporarily latches an address. The status register temporarily latches data that are necessary for operating the nonvolatile memory 2. The register 26 may be an SRAM, for example.

The sequencer 27, serving as a control circuit, receives a command from the register 26, and controls the nonvolatile memory 2 according to a sequence that is based on the command.

The voltage generation circuit 28 receives a power source voltage from the outside of the nonvolatile memory 2, and generates a plurality of voltages necessary for a write operation, a read operation, and an erase operation by using the power source voltage. The voltage generation circuit 28 supplies the generated voltages to a memory cell array 23, a sense amplifier 24, a row decoder 25, and the like in the planes PB via the MUX switch 29.

The memory cell array 23 is provided to each plane PB. The memory cell array 23 includes a plurality of blocks. Each of the plurality of blocks BLK includes a plurality of memory cell transistors (memory cells). To control voltages applied to the memory cell transistors, a plurality of bit lines, a plurality of word lines, a source line, and the like are provided to each memory cell array 23.

The planes PB0 to PB3 shown in FIG. 3 have the same configuration. Each plane PB includes the memory cell array 23, the sense amplifier 24, and the row decoder 25.

The row decoder 25 receives a row address from the register 26, and decodes the row address. The row decoder 25 performs a selection operation for a word line based on the decoded row address. Then, the row decoder 25 forwards a plurality of voltages necessary for the write operation, the read operation, and the erase operation to the selected block.

The sense amplifier 24 receives a column address from the register 26, and decodes the column address. The sense amplifier 24 includes a sense amplifier unit group 24A connected to the respective bit lines, and the sense amplifier unit group 24A selects a bit line based on the decoded column address. In reading data, the sense amplifier unit group 24A detects and amplifies data read from the memory cell transistor to the bit line. In writing data, the sense amplifier unit group 24A forwards the write data to the bit line.

The sense amplifier 24 includes a data register 24B. In reading data, the data register 24B temporarily latches data detected by the sense amplifier unit group 24A, and serially forwards the data to the input/output circuit 22. In writing data, the data register 24B temporarily latches data serially forwarded from the input/output circuit 22, and forwards the data to the sense amplifier unit group 24A. The data register 24B may be an SRAM, for example.

Voltages used by the memory cell array 23, the sense amplifier 24, and the row decoder 25 in writing or reading data are generated by the voltage generation circuit 28. In other words, the voltage generation circuit 28 generates various voltages necessary for writing data, various voltages necessary for reading data, and various voltages necessary for erasing data, and outputs these voltages to the MUX switch 29. In response to a sequence of the write operation or the read operation, the MUX switch 29 changes over the wirings to which the various voltages generated by the voltage generation circuit 28 are supplied.

(Block Configuration of Memory Cell Array)

Figure 4:
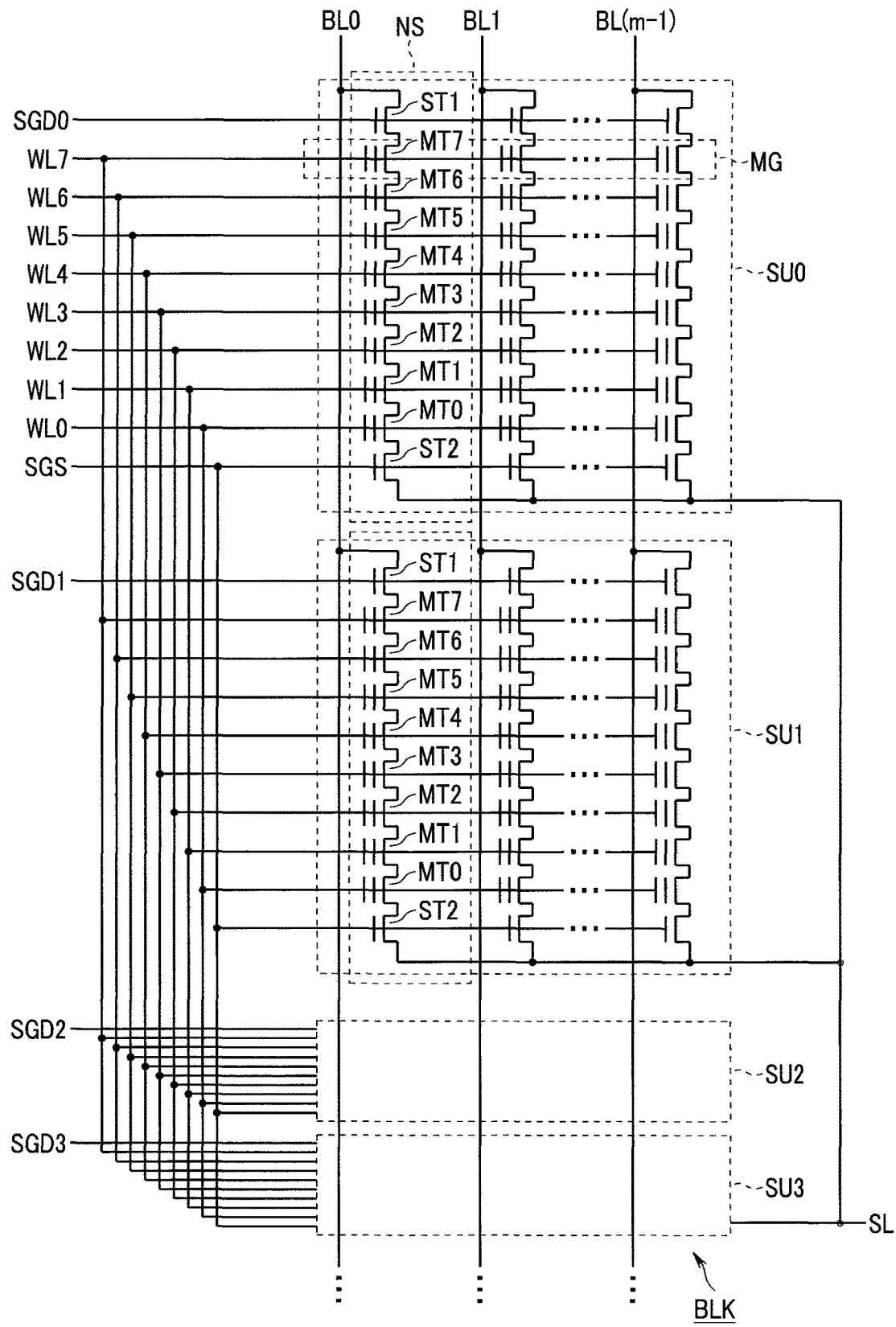
FIG. 4 is a view showing an equivalent circuit of a block BLK of a NAND memory cell array 23 having a three-dimensional structure in the nonvolatile memory 2 of the present embodiment.

FIG. 4 is a view showing an equivalent circuit of the block BLK of the NAND memory cell array 23 having a three-dimensional structure in the nonvolatile memory 2 of the present embodiment. FIG. 4 shows one block BLK of the plurality of blocks forming the memory cell array 23. Each of other blocks of the memory cell array also has a configuration substantially equal to the configuration shown in FIG. 4. The present embodiment is also applicable to a memory cell array having a two-dimensional structure.

As shown in the drawing, the block BLK includes, for example, four string units SU0 to SU3 (hereinafter representatively referred to as "string unit SU"). Each string unit SU includes a NAND string NS including a plurality of memory cell transistors MT (MT0 to MT7) and selection gate transistors ST1, ST2. In FIG. 4, the NAND string NS includes eight memory cell transistors MT. However, the NAND string NS may include a larger number of memory cell transistors MT. Although each of the selection gate transistors ST1, ST2 is shown as one transistor on the electric circuit, each of the selection gate transistors ST1, ST2 may have the same structural configuration as the memory cell transistor. A plurality of selection gate transistors may be used as each of the selection gate transistors ST1, ST2. A dummy cell transistor may be provided between the memory cell transistor MT and each of the selection gate transistors ST1, ST2.

The memory cell transistors MT are provided between the selection gate transistors ST1, ST2 in a state of being connected in series. The memory cell transistor MT7 on one end side (bit line side) is connected to the selection gate transistor ST1, and the memory cell transistor MT0 on the other end side (source line side) is connected to the selection gate transistor ST2.

Gates of the selection gate transistors ST1 of the string units SU0 to SU3 are respectively connected to selection gate lines SGD0 to SGD3 (hereinafter representatively referred to as "selection gate lines SGD"). Gates of the selection gate transistors ST2 of the string units SU0 to SU3 are respectively connected to selection gate lines SGS0 to SGS3 (hereinafter representatively referred to as "selection gate lines SGS"). Note that the gates of the plurality of selection gate transistors ST2 in each block BLK may be connected to a common selection gate line SGS.

Gates of the memory cell transistors MT0 to MT7 in the same block BLK are respectively connected in common to word lines WL0 to WL7. In other words, the word lines WL0 to WL7 in the string unit SU0, the word lines WL0 to WL7 in the string unit SU1, the word lines WL0 to WL7 in the string unit SU2, and the word lines WL0 to WL7 in the string unit SU3 are respectively connected in common in the same block BLK. However, the selection gate line SGD is independent for each of the string units SU0 to SU3 even in the same block BLK. The gates of the memory cell transistor MTi on the same row in the block BLK are connected to the same word line WLi.

Each NAND string NS is connected to a corresponding bit line. Accordingly, the respective memory cell transistors MT are connected to the bit line via the selection gate transistors ST1, ST2 and other memory cell transistors MT included in the NAND string NS. In general, data in the memory cell transistors MT in the same block BLK are collectively erased. In contrast, data are typically collectively read from and written into the plurality of memory cell transistors MT connected in common to one word line WL provided to one string unit SU. Such a set including the memory cell transistors MT for which a word line WL is used in common in one string unit SU is referred to as "memory cell group MG".

The write operation and the read operation for the memory cell group MG are performed in units of a page. For example, in a case where each cell is a TLC (triple level cell) that can latch data of 3 bits (8 values), one memory cell group MG can latch data for three pages. Each memory cell transistor MT can latch 3 bits, and the 3 bits respectively correspond to the three pages.

Figure 5:
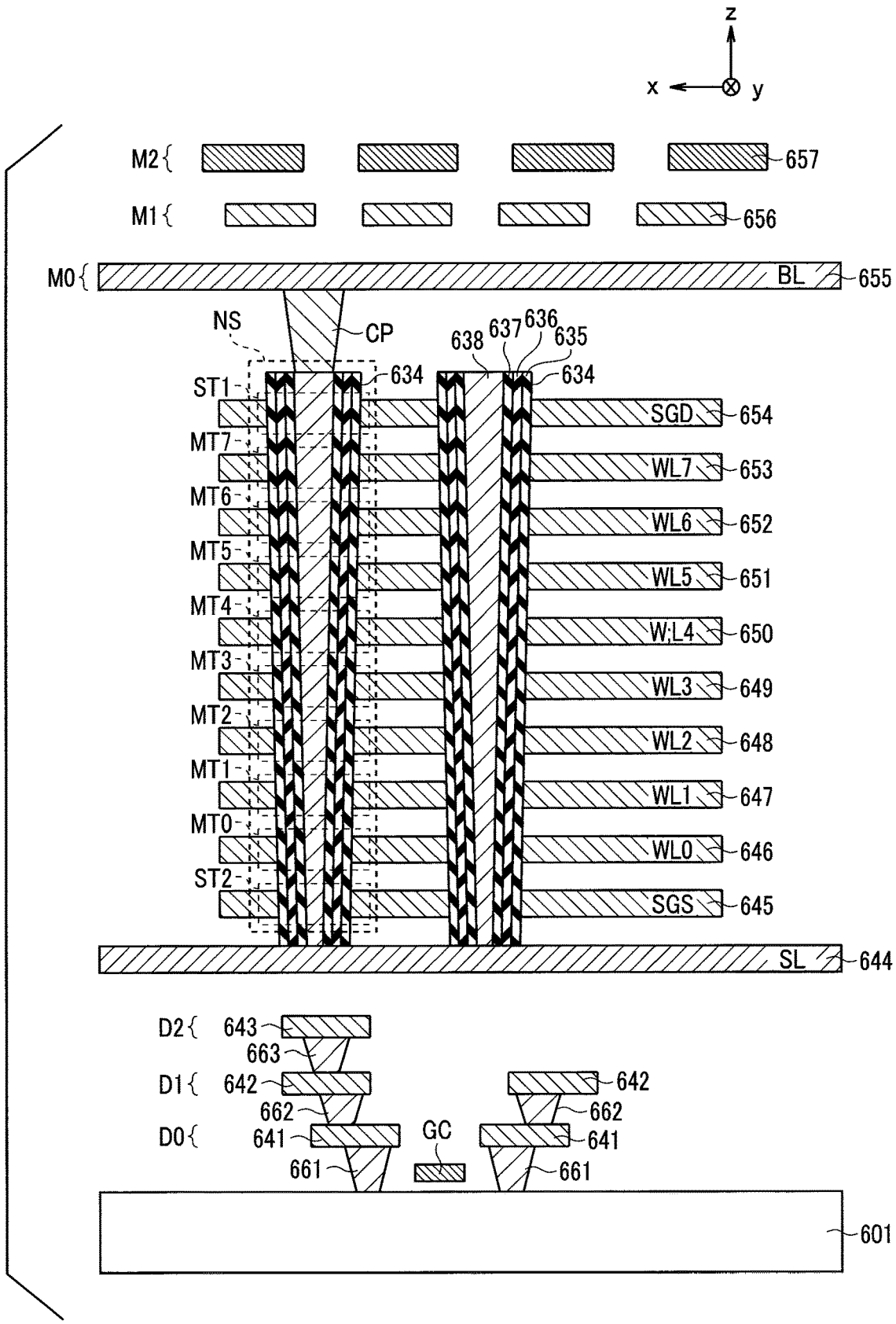
FIG. 5 is a view showing a configuration example of the block BLK of the NAND memory cell array 23 having the three-dimensional structure in the nonvolatile memory 2 of the present embodiment.

FIG. 5 is a view showing a configuration example of the block BLK of the NAND memory cell array 23 having the three-dimensional structure in the nonvolatile memory 2 of the present embodiment. FIG. 5 shows one block BLK of the plurality of blocks forming the memory cell array 23. Each of other blocks of the memory cell array also has a configuration substantially equal to the configuration shown in FIG. 5.

More specifically, FIG. 5 is a cross-sectional view of a portion of the block BLK of the NAND memory cell array 23 in the nonvolatile memory 2 of the present embodiment. As shown in FIG. 5, transistors included in peripheral circuits, such as the sense amplifier 24 and the row decoder 25, are formed on a semiconductor substrate 601, and memory cell transistors included in the memory cell array 23 are formed above the transistors included in the peripheral circuits. In the description made hereinafter, two directions that are horizontal to the surface of the semiconductor substrate 601 and that are orthogonal to each other are taken as the x direction and the y direction, and a direction perpendicular to the surface of the semiconductor substrate 601 is taken as the z direction.

In FIG. 5, illustration of p-type or n-type well regions formed on the upper surface portion of the semiconductor substrate 601, an impurity diffusion region formed in each well region, and an element isolation region that provides insulation between the well regions is omitted. A conductor GC is provided on the semiconductor substrate 601 with a gate insulating film (not shown in the drawing) interposed therebetween. The plurality of impurity diffusion regions (not shown in the drawing) are provided to the semiconductor substrate 601 in a state of sandwiching the conductor GC, and a plurality of contacts 661 are provided to the plurality of impurity diffusion regions. A plurality of conductors 641 form a wiring pattern, and are respectively connected to the plurality of contacts 661. For example, the conductor GC serves as the gate electrode of a transistor, and the conductors 641 serve as the source electrode or the drain electrode of the transistor.

For example, a contact 662 is provided on each conductor 641, and a conductor 642, forming a wiring pattern, is connected to the contact 662. A contact 663 is provided on the conductor 642, and a conductor 643, forming the wiring pattern, is connected to the contact 663. Wiring layers on which the conductors 641, 642, 643 are respectively provided are respectively referred to as wiring layers D0, D1, D2. The wiring layers D0, D1, D2 are provided at the lower layer portion of the nonvolatile memory 2. The wiring layers provided at the lower layer portion of the nonvolatile memory 2 are not limited to the three layers. Two or less wiring layers may be provided, or four or more wiring layers may be provided.

A conductor 644 is provided above the conductor 643 with an interlayer insulating film (not shown in the drawing), for example, interposed therebetween. The conductor 644 is formed into a plate shape parallel to the xy plane, for example, and serves as a source line SL. For example, conductors 645 to 654 are stacked above the conductor 644 in this order in the z direction with an interlayer insulating film (not shown in the drawing) interposed between the conductor 644 and the conductors 645 to 654.

Each of the conductors 645 to 654 is formed into a plate shape parallel to the xy plane, for example. For example, the conductor 645 serves as the selection gate line SGS, the conductors 646 to 653 respectively serve as the word lines WL0 to WL7, and the conductor 654 serves as the selection gate line SGD.

Memory pillars 634 having a columnar shape are provided such that each memory pillar 634 penetrates through the respective conductors 645 to 654 and comes into contact with the conductor 644. The memory pillar 634 includes, for example, a semiconductor layer 638, a tunnel insulating film 637, a charge accumulation film 636, and a block insulating film 635. The semiconductor layer 638 is provided at the center of the memory pillar 634. The tunnel insulating film 637 is formed on the outer side of the semiconductor layer 638. The charge accumulation film 636 is formed on the outer side of the tunnel insulating film 637. The block insulating film 635 is formed on the outer side of the charge accumulation film 636. Portions where the memory pillar 634 intersects with the respective conductors 646 to 654 serve as memory cell transistors (memory cells) MT. Portions where the memory pillar 634 intersects with the conductors 645, 654 serve as selection transistors ST.

Conductors 655 are provided above the upper surfaces of the memory pillars 634 with an interlayer insulating film (not shown in the drawing) interposed therebetween. Each conductor 655 is formed into a line shape extending in the x direction, and serves as a bit line BL. The plurality of conductors 655 are arranged at intervals in the y direction. The conductor 655 is, via a contact plug CP, electrically connected to the semiconductor layer 638 in one memory pillar 634 that corresponds to a string unit SU.

Specifically, in each string unit SU, for example, the contact plug CP is provided on the semiconductor layer 638 in each memory pillar 634, and one conductor 655 is provided on the contact plug CP. The configuration is not limited to such a configuration. For example, the semiconductor layer 638 may be connected to the conductor 655 via a plurality of contacts, wirings or the like.

Conductors 656 are provided above the layer, in which the conductor 655 is provided, with an interlayer insulating film (not shown in the drawing) interposed between the conductors 656 and the layer. Conductors 657 are provided above the layer, in which the conductors 656 are provided, with an interlayer insulating film (not shown in the drawing) interposed between the conductors 657 and the layer.

The conductors 656 and 657 serve as wirings that connect, for example, wirings provided to the memory cell array 23 to peripheral circuits provided below the memory cell array 23. The layer in which the conductor 655 is provided is referred to as a wiring layer M0, the layer in which the conductor 656 is provided is referred to as a wiring layer M1, and the layer in which the conductor 657 is provided is referred to as a wiring layer M2.

(Write Operation)

The write operation for data to the memory cell MT generally includes a program operation and a verify operation. The program operation is an operation of causing the threshold voltage of the memory cell MT to rise by injecting electrons into the charge accumulation film (or an operation of causing the threshold voltage to be maintained by inhibiting injection of electrons).

Figure 6:
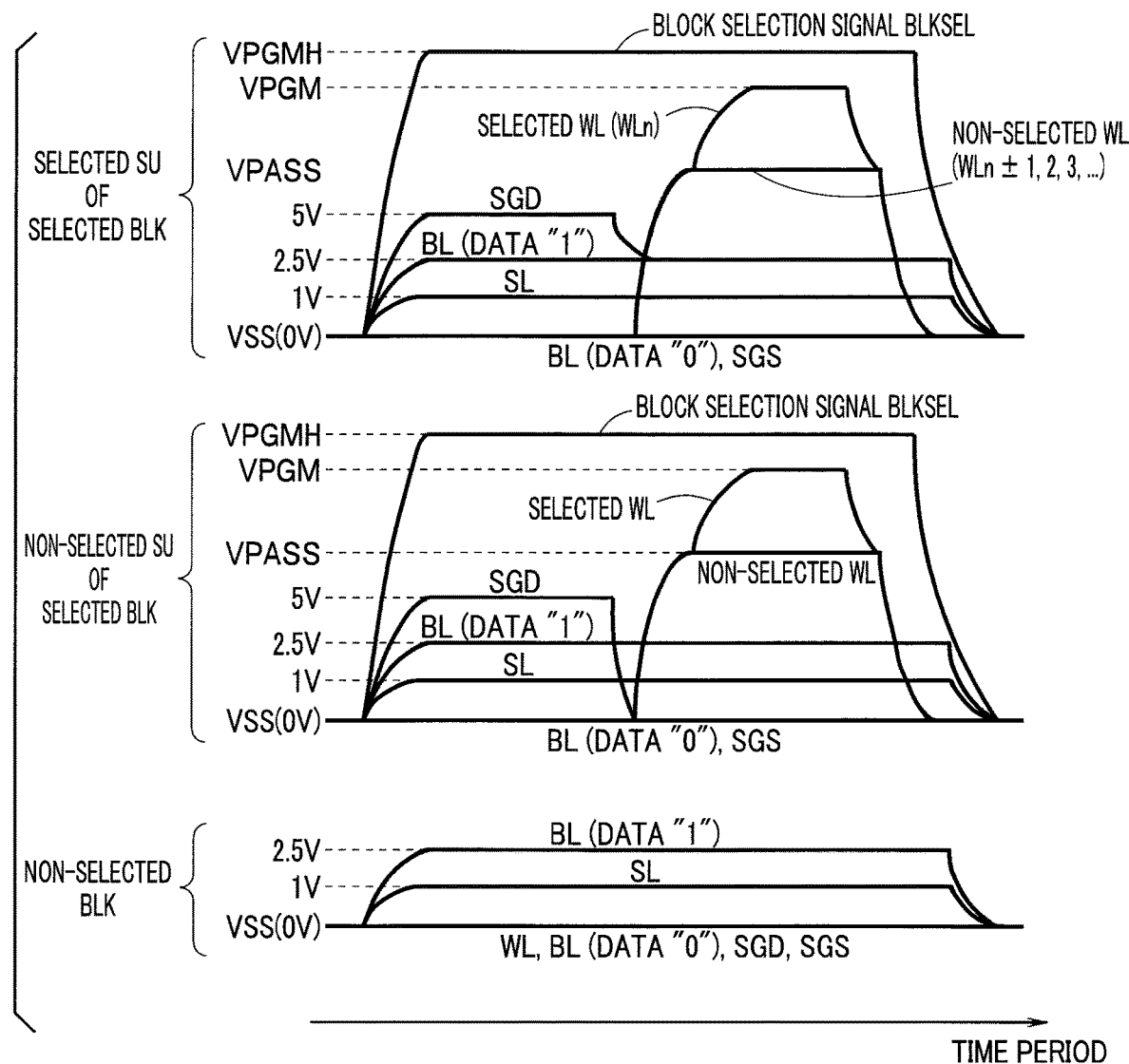
FIG. 6 is a view showing a change in potential of respective wirings in a write operation (program operation)

FIG. 6 is a view showing a change in potential of respective wirings in the write operation (program operation). The voltage generation circuit 28 generates various voltages shown in FIG. 6, and the MUX switch 29 assigns the various voltages shown in FIG. 6 to the respective wirings according to the control of the sequencer 27.

The program operation is performed according to a program voltage and a bit line voltage applied to the word line and the bit line. As shown in FIG. 6, a block BLK where a program voltage VPGM is not applied to the word line (a selected WL, a non-selected WL in FIG. 6) is a non-selected BLK (a lower part of FIG. 6) not being the write target. The bit line voltage is applied to the memory cell transistors MT when the selection gate transistor ST1 connected to the bit line BL is caused to conduct. Accordingly, of string units SU of the blocks BLK (selected BLKs) being the write targets, a string unit SU where a voltage that causes the selection gate transistor ST1 to conduct is not applied to the selection gate line SGD is a non-selected SU (a middle part of FIG. 6) not being the write target. Further, in the non-selected SU of the selected BLK (the middle part of FIG. 6), before the program voltage VPGM is applied, the selection gate line SGD may be set to 5 V, for example, to cause the selection gate transistor ST1 to conduct.

In a string unit SU (selected SU), being the write target, of the block BLK (selected BLK), being the write target, (an upper part of FIG. 6), before the program voltage VPGM is applied, as shown on the left side of the upper part of FIG. 6, the selection gate line SGD is set to 5 V, for example, to cause the selection gate transistor ST1 to conduct. During the program operation, the selection gate line SGS is 0 V, for example. Accordingly, the selection gate transistor ST2 is in an OFF state. In contrast, as shown on the right side of the upper part of FIG. 6, when the program voltage VPGM is applied, the selection gate line SGD is set to 2.5 V, for example. With such a configuration, whether the selection gate transistor ST1 is in a conducting state or a non-conducting state is decided based on the bit line voltage of the bit line BL connected to the selection gate transistor ST1.

As described above, the sense amplifier 24 forwards data to the respective bit lines BL. A ground voltage Vss of 0 V, for example, is applied as a bit line voltage Vbl_L to the bit lines BL to which data "0" is supplied. A writing inhibit voltage Vinhibit (for example, 2.5 V) is supplied as a bit line voltage Vbl_H to the bit lines BL to which data "1" is supplied. Accordingly, when the program voltage VPGM is applied, the selection gate transistors ST1 connected to the bit lines BL to which data "0" is supplied are caused to conduct, and the selection gate transistors ST1 connected to the bit line BL to which data "1" is supplied are cut off. There is an inhibition of writing of data to the memory cell transistors MT connected to the selection gate transistor ST1 that is cut off.

In each memory cell transistor MT connected to the selection gate transistor ST1 that is in a conducting state, electrons are injected into the charge accumulation film according to a voltage applied to the word line WL. The memory cell transistor MT connected to the word line WL (non-selected WL) to which a voltage VPASS is applied as a word line voltage is brought into a conducting state irrespective of the threshold voltage. However, electrons are not injected into the charge accumulation film. In contrast, in the memory cell transistor MT connected to the word line WL (selected WL) to which the program voltage VPGM is applied as a word line voltage, electrons are injected into the charge accumulation film according to the program voltage VPGM.

In other words, the row decoder 25 selects any of the word lines WL in the selected block BLK, applies the program voltage VPGM to the selected word line (selected WL), and applies the voltage VPASS to other word lines (non-selected word lines) WL (non-selected WL). The program voltage VPGM is a high voltage for injecting electrons into the charge accumulation film due to a tunnel phenomenon, and VPGM>VPASS is established. By supplying data to the respective bit lines BL with the sense amplifier 24 while controlling the voltages of the word lines WL with the row decoder 25, the write operation (program operation) for the respective memory cell transistors MT of the memory cell array 23 is performed.

In the selected block BLK, a block selection signal BLKSEL at a voltage VPGMH is supplied to the row decoder 25.

Figure 7:
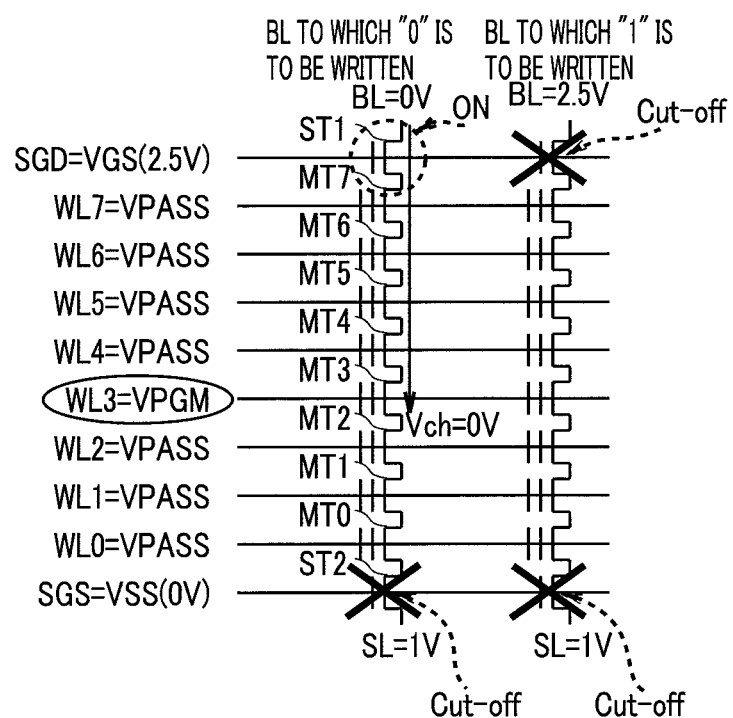
FIG. 7 is a circuit diagram showing states of strings during the program operation.

FIG. 7 is a circuit diagram showing states of strings during the program operation. FIG. 7 shows two NAND strings that correspond to the bit line BL being the target to which "0" is to be written and the bit line BL being the target to which "1" is to be written. FIG. 7 also shows a state where the word line WL3 is selected.

As shown in the drawing, the voltage VPGM is applied to the selected word line WL3, and the voltage VPASS is applied to the non-selected word lines WL0 to WL2 and WL4 to WL7. In the NAND string that corresponds to the bit line BL being the target to which "0" is to be written, the selection transistor ST1 is in an ON state. Therefore, a channel potential Vch of the memory cell transistor MT3 connected to the selected word line WL3 is 0 V. In other words, a potential difference between a control gate and a channel increases and, as a result, electrons are injected into the charge accumulation film, so that the threshold voltage of the memory cell transistor MT3 rises.

In the NAND string that corresponds to the bit line BL being the target to which "1" is to be written, the selection transistor ST1 is in a cut-off state. Therefore, the channel of the memory cell transistor MT3 connected to the selected word line WL3 is in an electrically floating state, and a channel potential Vch rises to a value close to the voltage VPGM due to capacitive coupling with the word line WL or the like. In other words, a potential difference between the control gate and the channel decreases and, as a result, electrons are not injected into the charge accumulation film, so that the threshold voltage of the memory cell transistor MT3 is maintained (the threshold voltage does not fluctuate to the extent that the level of threshold voltage distribution shifts to higher distribution).

(Threshold Voltage Distribution)

In writing multi-valued data to the memory cell transistor MT, the threshold voltage of the memory cell transistor MT is set to a value that corresponds to the value of the data. When the program voltage VPGM and a bit line voltage Vbl are applied to the memory cell transistor MT, electrons are injected into the charge accumulation film of the memory cell transistor MT, so that the threshold voltage rises. By increasing the amount of injection of electrons by increasing the program voltage VPGM, it is possible to increase the threshold voltage of the memory cell transistor MT. However, due to the variations in the memory cell transistors MT, even when the same program voltage VPGM is applied, a different amount of electrons are injected for each memory cell transistor MT. Electrons that are injected once are held until the erase operation is performed. Therefore, as will be described later, the program operation and the verify operation (loop) are performed a plurality of times while the program voltage VPGM is caused to gradually rise such that the threshold voltage falls within a range that can be allowed as the threshold voltage to be set for each memory cell transistor MT. The verify operation is the read operation performed as a part of the write operation.

Figures 8, 9:
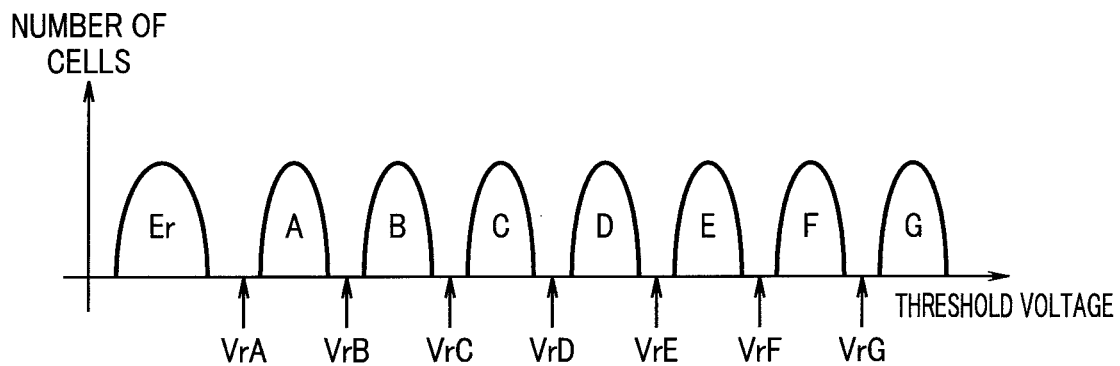
FIG. 8 is a graph showing threshold distribution in the memory cell array, with threshold voltage shown on the horizontal axis and the number of memory cell transistors (the number of cells) shown on the vertical axis.
FIG. 9 is an explanatory diagram showing 2-3-2 coding as one example of coding.

FIG. 8 is a graph showing threshold distribution in the memory cell array, with threshold voltage shown on the horizontal axis and the number of memory cell transistors (the number of cells) shown on the vertical axis. FIG. 8 shows an example of threshold distribution in the nonvolatile memory 2 having 3 bit/Cell. In the nonvolatile memory 2, the threshold voltages of the memory cell transistors MT are set according to the respective data values of multi-valued data to be stored in the memory cell transistors MT. Charges are stochastically injected into the charge accumulation film (charge holding region) and hence, as shown in FIG. 8, the threshold voltages of the respective memory cell transistors MT are distributed statistically.

In FIG. 8, threshold distribution is shown by eight lobe-shaped regions in an Er state, an A state, a B state, a C state, . . . , a G state, and the ranges of the threshold voltages in these regions correspond to respective target regions. In the example shown in FIG. 8, by setting the threshold voltage of the memory cell transistor MT to within any one of the eight target regions, it is possible to cause the memory cell transistor MT to store data with 8 values (3-bit data).

In the present embodiment, a target region, where a threshold voltage Vth is equal to or less than a voltage VrA shown in FIG. 8, is referred to as the Er state. A target region, where the threshold voltage is larger than the voltage VrA and equal to or less than a voltage VrB, is referred to as the A state. A target region where the threshold voltage is larger than the voltage VrB and is equal to or less than a voltage VrC is referred to as the B state. A target region where the threshold voltage is larger than the voltage VrC and is equal to or less than a voltage VrD is referred to as the C state. In the same manner, as shown in FIG. 8, a D state to the G state are set according to respective voltages.

In other words, the state indicates a target region that corresponds to a data value to be stored in each memory cell transistor MT. In a case of 3 bits for 8 values, the target regions can be classified into eight states of Er, A to G states. The voltages VrA to VrG are reference voltages forming boundaries of the respective target regions. In the verify operation, a configuration may be adopted where reading is performed by applying voltages VrA to VrG to each word line WL as a verify level (voltage), and when the target memory cell transistor MT is brought into an OFF state, it is determined that the threshold voltage has reached a threshold voltage corresponding to the state.

As a method for performing coding of causing data values to correspond to the respective states (that is, threshold distribution) in the memory cell transistor, any of various methods may be adopted. FIG. 9 is an explanatory diagram showing 2-3-2 coding as one example of coding. FIG. 9 shows values of an upper (high-order) bit, a middle (middle-order) bit, and a lower (low-order) bit of data for respective threshold distributions.

The example shown in FIG. 9 shows that the memory cell transistor in the Er state stores data (1, 1, 1), the memory cell transistor in the A state stores data (1, 1, 0), the memory cell transistor in the B state stores data (1, 0, 0), the memory cell transistor in the C state stores data (0, 0, 0), the memory cell transistor in the D state stores data (0, 1, 0), the memory cell transistor in the E state stores data (0, 1, 1), the memory cell transistor in the F state stores data (0, 0, 1), and the memory cell transistor in the G state stores data (1, 0, 1).

A data group consisting of the upper bits of the respective memory cell transistors is referred to as "upper page". A data group consisting of the middle bits of the respective memory cell transistors is referred to as "middle page". A data group consisting of the lower bits of the respective memory cell transistors is referred to as "lower page". In general, the reading is performed in units of such a page.

If the reading is not performed in units of a page, but is performed to determine values of 3 bits of data stored in the respective memory cell transistors, it is necessary to change a read voltage applied to the selected word line WL a maximum of seven times, that is, it is necessary to change the read voltage to a voltage ranging from the voltage VrA to the voltage VrG. In contrast, in a case of performing the reading in units of a page, the reading can be achieved by changing a voltage two or three times.

For example, in a case of reading values on the upper pages in the respective memory cell transistors, it is sufficient to change the read voltage a maximum of two times, that is, it is sufficient to change the read voltage to the voltage VrC and the voltage VrG. For example, in performing the reading by applying the read voltage VrC to the selected word line WL, when the sense amplifier 24 determines that the memory cell transistor being the read target is in a conducting state, it is possible to determine that the upper page in the memory cell transistor being the read target is "1".

For example, in performing the reading by applying the read voltage VrC to the selected word line WL, when the sense amplifier 24 determines that the memory cell transistor being the read target is in a non-conducting state, then, the reading is performed by applying the read voltage VrG. As a result, when the sense amplifier 24 determines that the memory cell transistor being the read target is in a conducting state, it is possible to determine that the upper page in the memory cell transistor being the read target is "0". When the sense amplifier 24 determines that the memory cell transistor being the read target is in a non-conducting state, it is possible to determine that the upper page in the memory cell transistor being the read target is "1".

As described above, in the 2-3-2 coding shown in FIG. 9, the reading can be achieved by merely changing the read voltage a maximum of two times for the upper page, a maximum of three times for the middle page, and a maximum of two times for the lower page. FIG. 10 shows coding with Gray code where only 1 bit data is changed between any two adjacent regions.

FIG. 10 is a view for describing one example of a standard write sequence. FIG. 10 shows, as an example, a case where the combination of the program operation and the verify (program verify) operation is repeated 19 times to write data. This repeated operation is referred to as "loop". The program voltage VPGM in the first loop is set to the lowest voltage value. As the loop progresses to the second loop, the third loop . . . , a larger voltage value is set as the program voltage VPGM. Each circle symbol in FIG. 10 indicates a loop where the program verify operation can be performed. At each of the A to G states, the program operation is performed from the first loop to the maximum loop where the circle symbol is included. Hereinafter, of the first to nineteenth loops, the loop performed for the n-th time is referred to as "n-th loop".

For example, in the memory cell MT that is set to the B state, there is a possibility that the program operation is performed from the first loop to the maximum eighth loop while the program voltage VPGM is gradually increased. The program verify operation is performed only in the loop with a circle symbol. When it is determined that the threshold voltage of the memory cell MT has reached a set target region due to the program verify operation, the writing of data to such a memory cell MT is inhibited thereafter.

Figure 11:
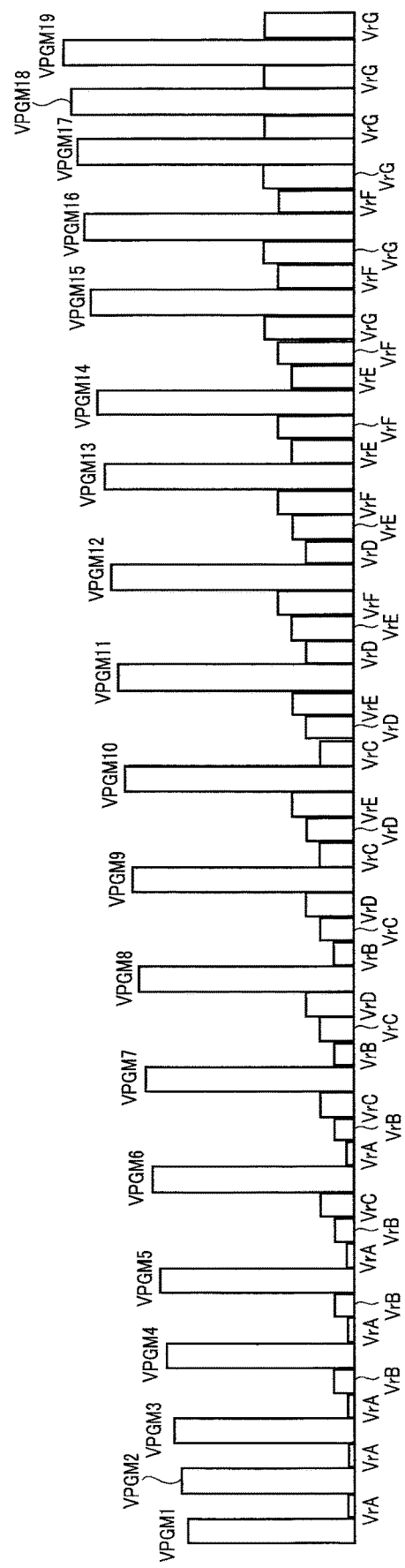
FIG. 11 is an explanatory diagram showing the standard write sequence in a write operation.

FIG. 11 is an explanatory diagram showing the standard write sequence in the write operation. FIG. 11 shows a change in the program voltage VPGM and timings of the program operation and the verify operation in performing the write operation based on the standard write sequence, with time period shown on the horizontal axis and voltage shown on the vertical axis. In other words, FIG. 11 shows an example of the write sequence with 19 loops where writing is performed by changing the program voltage VPGM 19 times. The write sequences for the respective planes PB are performed synchronously.

As shown in FIG. 11, in the standard write sequence, the program voltage VPGM applied to the selected word line WL is sequentially increased for each loop. To determine whether the threshold voltage Vth of each memory cell MT has reached a value higher than a verify voltage as a result of the writing in each loop, the verify operation is performed for one or more states. In the example shown in FIG. 11, ultimately, the program operation is performed 19 times (VPGM1 to VPGM19) and the verify operation is performed 42 times (VrA to VrG) in a maximum of 19 loops.

(MUX Switch)

Figure 12:
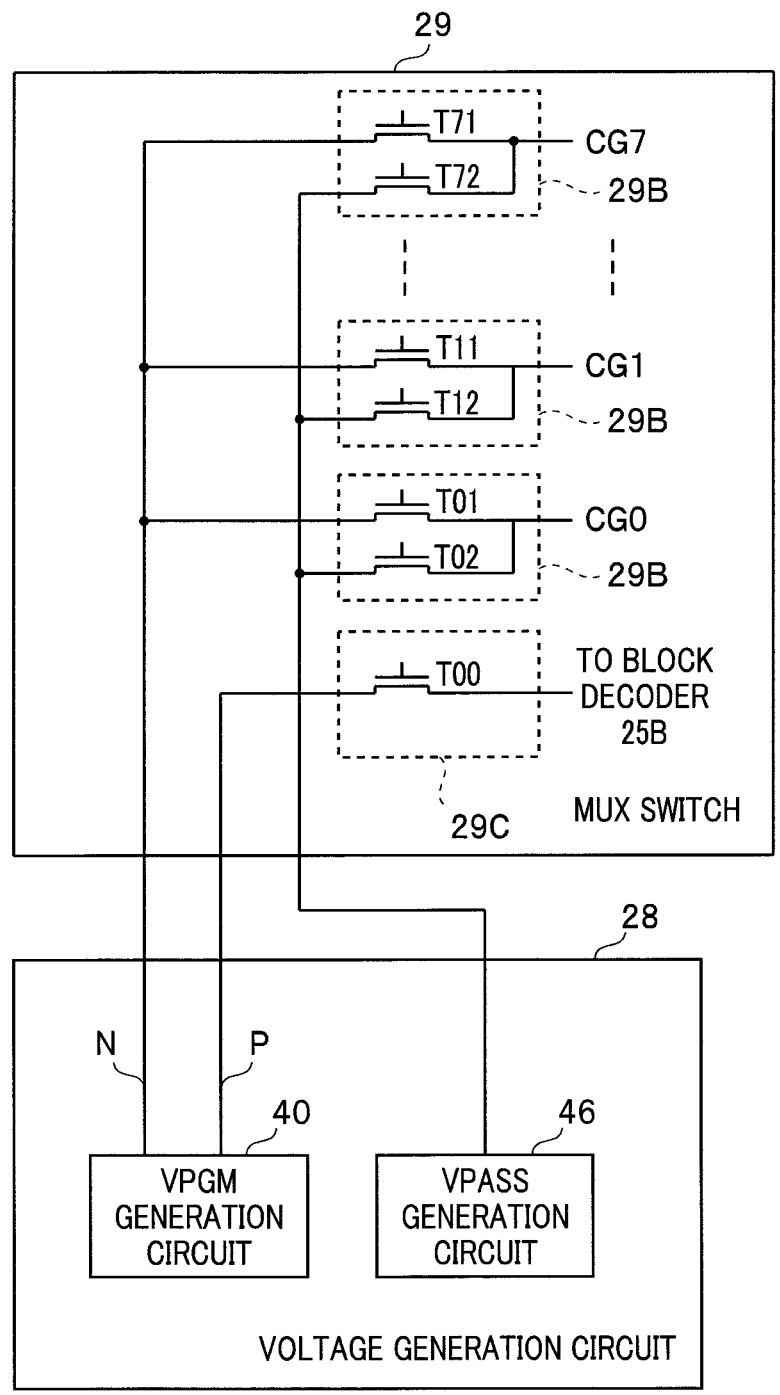
FIG. 12 is a block diagram showing configurations of portions of a voltage generation circuit 28 and a MUX switch 29.

FIG. 12 is a block diagram showing configurations of portions of the voltage generation circuit 28 and the MUX switch 29 shown in FIG. 2. FIG. 12 only shows a VPGM generation circuit 40 and a VPASS generation circuit 46 of the respective circuits that form the voltage generation circuit 28, and only shows the circuit portion that corresponds to the voltage generation circuit 28 shown in FIG. 12 of the respective circuits that form the MUX switch 29.

The VPGM generation circuit 40 of the voltage generation circuit 28 generates a voltage VPGM from an output node N, and the VPASS generation circuit 46 generates a voltage VPASS. The MUX switch 29 includes a plurality of switches T01 and T02, switches T11 and T12, . . . , switches T71 and T72 and switch TOO each of which is formed of a transistor. The program voltage VPGM from the VPGM generation circuit 40 is supplied to the switches T01, T11, . . . , T71, and the voltage VPASS from the VPASS generation circuit 46 is supplied to the switches T02, T12, . . . , T72. The switches T01 and T02, the switches T11 and T12, . . . and the switches T71 and T72 are respectively connected to signal lines CG0, CG1, CG7 which will be described later. The switches T01 and T02 correspond to a changeover switch 29B that supplies a voltage to the signal line CG0. The switches T11 and T12 correspond to the changeover switch 29B that supplies a voltage to the signal line CG1. The switches T71 and T72 correspond to the changeover switch 29B that supplies a voltage to the signal line CG7.

In the VPGM generation circuit 40, the voltage VPGMH is generated from an output node P, and the voltage VPGMH is supplied to a block decoder 25B, which will be described later, via the switch TOO.

The switches T01 and T02, the switches T11 and T12, . . . and the switches T71 and T72 are controlled by the sequencer 27, and supply the program voltages VPGM, VPASS to the signal lines CG0 to CG7.

(Row Decoder)

Figure 13:
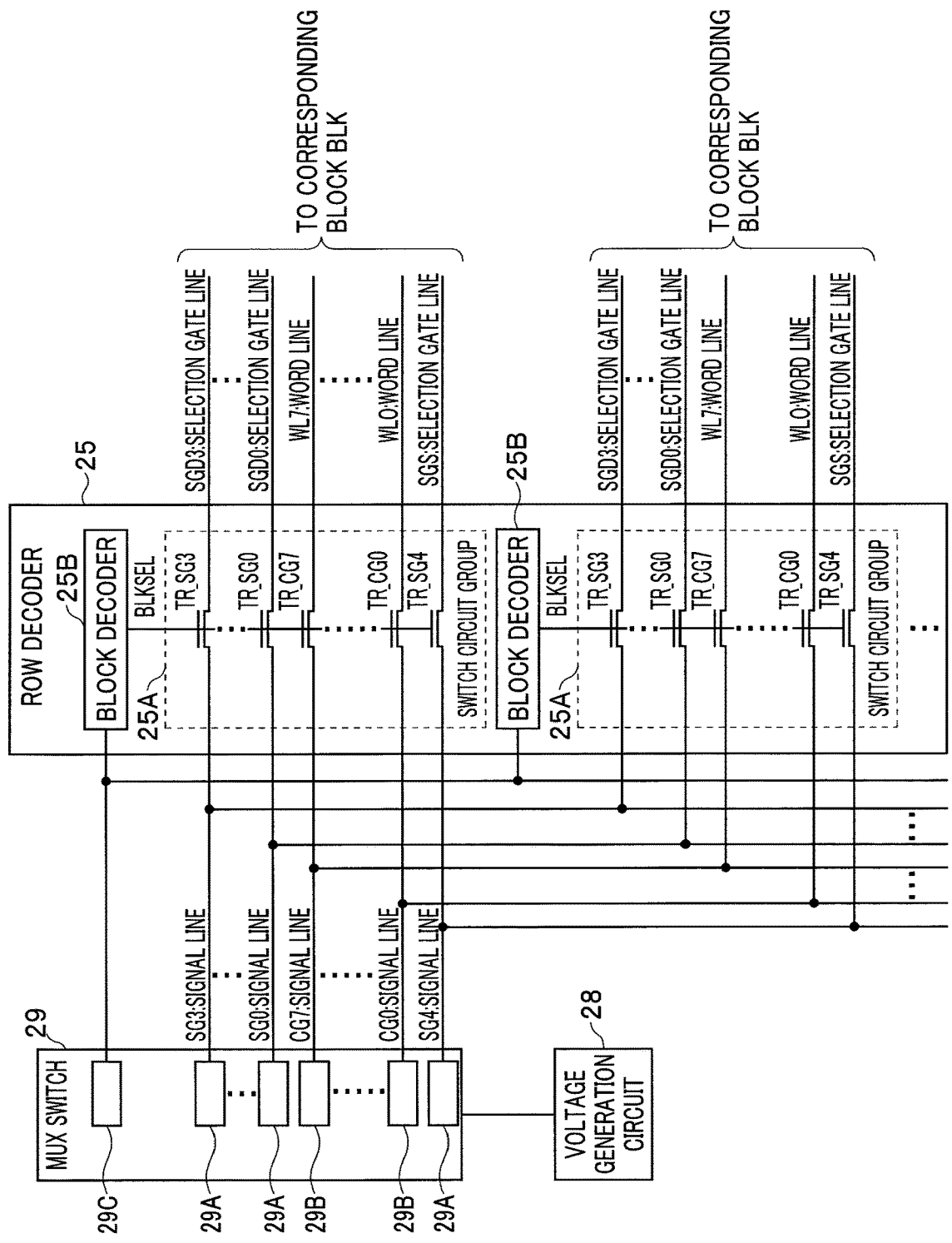
FIG. 13 is a block diagram showing one example of a configuration of a row decoder 25 shown in FIG. 3.

FIG. 13 is a block diagram showing one example of a configuration of the row decoder 25 shown in FIG. 3.

In FIG. 13, the MUX switch 29 includes changeover switches 29A, 29B, 29C. The changeover switches 29A respectively supply the voltages from the voltage generation circuit 28 to signal lines SG0 to SG4. The plurality of changeover switches 29B correspond to the switches T01 to T71, T02 to T72 shown in FIG. 12, and supply the voltages from the voltage generation circuit 28 to the signal lines CG0 to CG7 respectively. The changeover switch 29C corresponds to the switch TOO shown in FIG. 12, and supplies the voltage VPGMH from the voltage generation circuit 28 to the block decoder 25B.

The signal lines SG0 to SG4, CG0 to CG7 are branched by the row decoder 25, and are connected to the wirings of respective blocks BLK. In other words, the signal lines SG0 to SG3 serve as global-drain-side selection gate lines, and are connected to the selection gate lines SGD0 to SGD3, serving as local selection gate lines in each block BLK, via the row decoder 25. The signal lines CG0 to CG7 serve as global word lines, and are connected to the word lines WL0 to WL7, serving as local word lines in each block BLK, via the row decoder 25. The signal line SG4 serves as a global-source-side selection gate line, and is connected to the selection gate line SGS, serving as a local selection gate line in each block BLK, via the row decoder 25.

The voltage generation circuit 28 generates various voltages according to the control of the sequencer 27. The changeover switches 29A, 29B respectively supply the generated various voltages to the corresponding signal lines SG0 to SG4 and the signal lines CG0 to CG7. For example, each changeover switch 29B selectively supplies a voltage, such as a voltage VCGRV, a voltage VREAD, or a voltage VCG_ER, to a corresponding word line WL according to the target (row address) of the operation in the read operation.

The row decoder 25 includes a plurality of switch circuit groups 25A and a plurality of block decoders 25B, the plurality of switch circuit groups 25A respectively corresponding to the respective blocks, the plurality of block decoders 25B being provided in a state of respectively corresponding to the plurality of switch circuit groups 25A. Each switch circuit group 25A includes a plurality of transistors TR_SG0 to TR_SG3, a plurality of transistors TR_CG0 to TR_CG7, and a transistor TR_SG4, the plurality of transistors TR_SG0 to TR_SG3 respectively connecting the signal lines SG0 to SG3 to the selection gate lines SGD0 to SGD3, the plurality of transistors TR_CG0 to TR_CG7 respectively connecting the signal lines CG0 to CG7 to the word lines WL0 to WL7, the transistor TR_SG4 connecting the signal line SG4 to the selection gate line SGS. Each of the transistors TR_SG0 to TR_SG4 and the transistors TR_CG0 to TR_CG7 is a high withstand voltage transistor.

When each block decoder 25B per se is designated by a row address, each block decoder 25B supplies a block selection signal BLKSEL to the gates of the transistors TR_SG0 to TR_SG4 and the gates of the transistors TR_CG0 to TR_CG7. With such an operation, in the switch circuit group 25A to which the block selection signal BLKSEL is supplied from the block decoder 25B designated by the row address, the transistors TR_SG0 to TR_SG4 and the transistors TR_CG0 to TR_CG7 are brought into an ON state, thus being caused to conduct. Accordingly, the voltages supplied from the voltage generation circuit 28 to the signal lines SG0 to SG4 and the signal lines CG0 to CG7 are supplied to the selection gate lines SGD0 to SGD3, SGS and the word lines WL0 to WL7 included in the block BLK being the operation target.

In other words, various voltages necessary for the operations are supplied to the respective word lines WL by the voltage generation circuit 28, the MUX switch 29, and the row decoder 25. For example, a voltage VSGD is supplied to a selection gate line SGD (SGDsel) connected to the selection gate transistor ST1 belonging to the string unit SU being the operation target. A voltage Vss is supplied to a selection gate line SGD (SGDusel) connected to the selection gate transistor ST1 not belonging to the string unit SU being the operation target. A voltage VSGS is supplied to the selection gate lines SGS collectively connected to the selection gate transistor ST2 in each block BLK.

To cause each transistor of the switch circuit group 25A to conduct, it is necessary for the block decoder 25B to generate a block selection signal BLKSEL at a voltage higher than the voltage VPGM. The block decoder 25B generates the block selection signal BLKSEL at a high voltage by using the voltage VPGMH supplied from the MUX switch 29. The voltage VPGMH and the voltage VPGM are generated by the VPGM generation circuit 40 in the voltage generation circuit 28.

(Voltage Generation Circuit)

Figure 14:
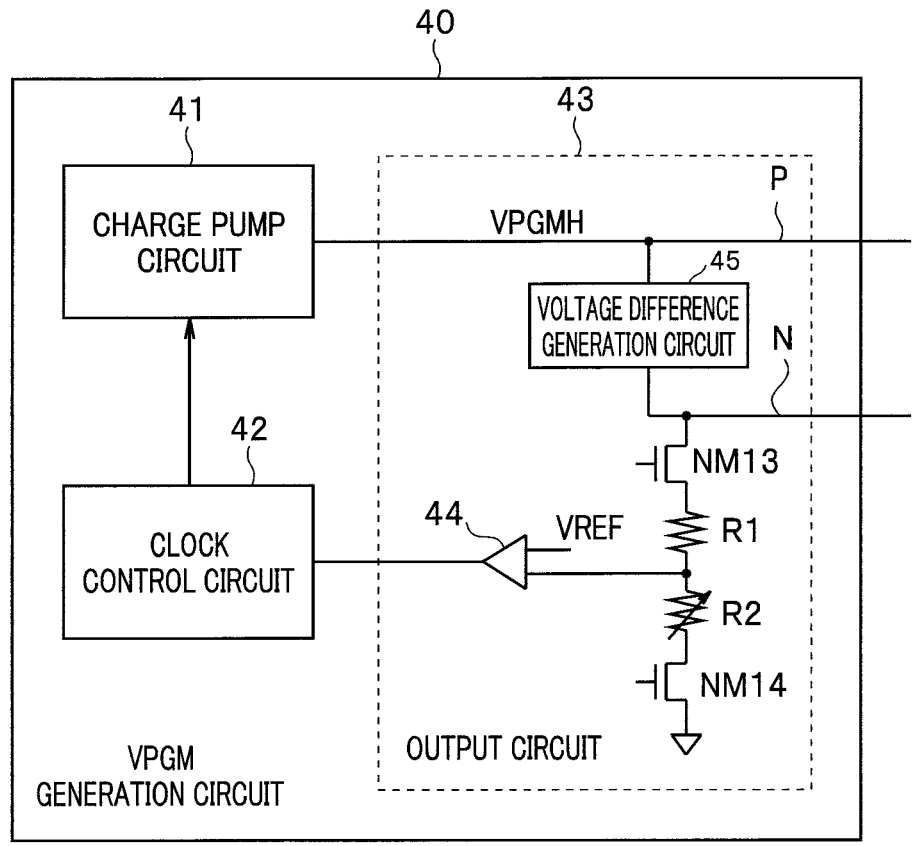
FIG. 14 is a block diagram showing one example of a specific configuration of a VPGM generation circuit 40 forming the voltage generation circuit 28 shown in FIG. 12.
Figure 15:
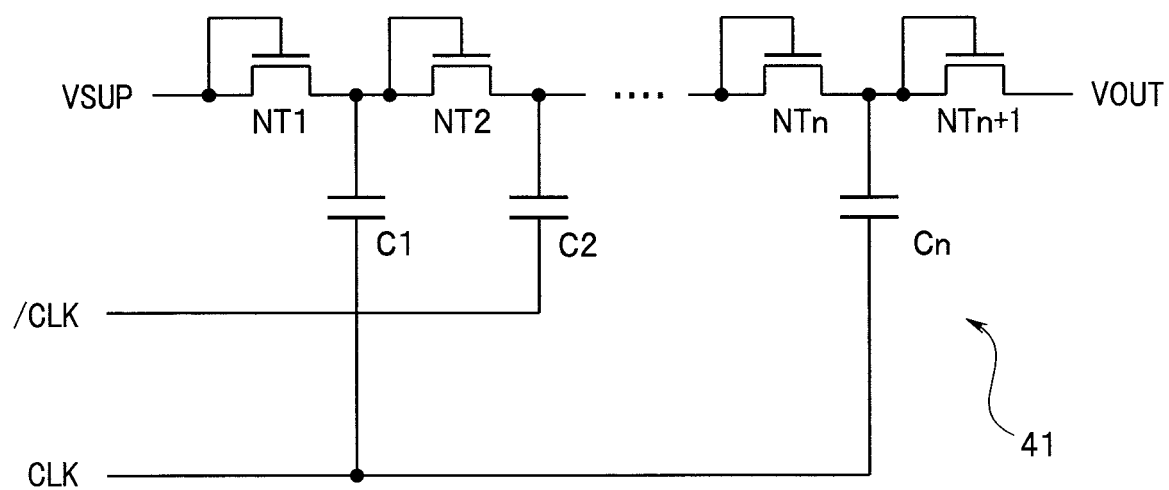
FIG. 15 is a circuit diagram showing one example of a specific configuration of a charge pump circuit 41 shown in FIG. 14.

FIG. 14 is a block diagram showing one example of a specific configuration of the VPGM generation circuit 40 forming the voltage generation circuit 28 shown in FIG. 12. FIG. 15 is a circuit diagram showing one example of a specific configuration of a charge pump circuit 41 shown in FIG. 14.

A clock control circuit 42 generates a clock signal CLK and a clock signal /CLK, which is an inverted signal of the clock signal CLK. The clock control circuit 42 supplies clocks CLK, /CLK, which are complementary to each other, to the charge pump circuit 41. The charge pump circuit 41 generates a predetermined voltage VOUT by using the clocks CLK, /CLK supplied from the clock control circuit 42.

As shown in FIG. 15, the charge pump circuit 41 includes n+1 number of NMOS transistors NT1, NT2, . . . , NTn, NTn+1 and n number of capacitors C1 to Cn. The number n of NMOS transistors and the number n of capacitors in the charge pump circuit 41 may be suitably set.

Each of the NMOS transistors NT1 to NTn+1 is diode-connected, thus serving as a diode. The current paths of the NMOS transistors NT1 to NTn+1 are sequentially connected in series. One end of the capacitor C1 to Cn is electrically connected to one end of the NMOS transistor NT1 to NTn on the output side of the current path. The clock signal CLK is supplied to the other end of the capacitor C1, C3, C5, . . . , and the clock signal /CLK is supplied to the other end of the capacitor C2, C4, C6, . . . .

A voltage VSUP (for example, the power source voltage VDD) is supplied to one end of the NMOS transistor NT1 on the input side of the current path. The capacitors C1 to Cn repeat charge and discharge in response to the clock signals CLK, /CLK having the amplitude of the power source voltage VDD, for example, so that the inputted voltage VSUP is boosted and is subsequently forwarded to the transistors on the downstream side. As a result, an output voltage VOUT larger than the voltage VSUP is generated on the output side of the current path of the transistor NTn+1.

The charge pump circuit 41 can generate voltages at different levels in the respective diode-connected NMOS transistors. The voltage generation circuit 28 generates a plurality of kinds of voltages necessary for the above-mentioned write operation, read operation, and the like from the output from the charge pump circuit 41.

Of the respective circuits forming the voltage generation circuit 28, FIG. 14 shows the VPGM generation circuit 40 that generates the program voltage VPGM by using an output from the charge pump circuit 41. The output VOUT from the charge pump circuit 41 is supplied to an output circuit 43 as the voltage VPGMH. In the output circuit 43, a voltage difference generation circuit 45 is connected to the voltage difference generating current path between the output node N and a power source line to which the voltage VPGMH is supplied. The voltage difference generation circuit 45 generates a voltage difference AV between an output terminal of the charge pump circuit 41 and the output node N. For the circuit that generates a voltage difference, for example, it is possible to adopt two diode-connected NMOS transistors where current paths are connected in series.

The current path of an NMOS transistor NM13, a resistor R1, a variable resistor R2, and the current path of an NMOS transistor NM14 are connected in series between the output node N and the reference potential point. A connection point between the resistors R1, R2 is connected to one input terminal of a comparator 44. A reference voltage VREF is applied to the other input terminal of the comparator 44. The comparator 44 outputs a stop signal to the clock control circuit 42 during the period in which a voltage at the connection point between the resistors R1, R2 is higher than the reference voltage VREF. During the period in which the stop signal is outputted from the comparator 44, the clock control circuit 42 stops the generation of clock signals CLK, /CLK. The transistors NM13, NM14, the resistors R1, R2, and the comparator 44 form a limit circuit.

When control signals are supplied to the transistors NM13, NM14 from the sequencer 27 (not shown in the drawing), the transistors NM13, NM14 are brought into an ON state during the period in which the limit circuit is being caused to function. During the period in which the transistors NM13, NM14 are in an ON state, a voltage that appears at the output node N is divided by the resistors R1, R2. The voltage at the connection point between the resistors R1, R2 is compared with the reference voltage VREF by the comparator 44. The reference voltage VREF is set to a voltage at the connection point between the resistors R1, R2 at the time of the voltage that appears at the output node N being the specified program voltage VPGM.

Accordingly, when a voltage that appears at the output node N exceeds the specified program voltage VPGM, the voltage at the connection point between the resistors R1, R2 becomes higher than the reference voltage VREF, so that a stop signal is generated from the comparator 44. In response to such a stop signal, the clock control circuit 42 stops the generation of clock signals CLK, /CLK. As a result, the output voltage of the charge pump circuit 41 reduces, an increase in voltage at the output node N is suppressed, and the voltage at the output node N is maintained at the specified program voltage VPGM. Also in the case where a voltage that appears at the output node N is lower than the specified program voltage VPGM, with substantially the same operation, the voltage at the output node N increases, and the voltage at the output node N is maintained at the specified program voltage VPGM.

In other words, a feedback loop is formed by the charge pump circuit 41, the voltage difference generation circuit 45, the transistors NM13, NM14, the resistors R1, R2, the comparator 44, and the clock control circuit 42. By controlling the voltage division of the resistors R1, R2, it is possible to decide the voltage VPGM. The output voltage of the charge pump circuit 41 is changed to allow the acquisition of the voltage VPGM, so that a voltage VPGMH which is higher than the voltage VPGM by ΔV is acquired.

The voltage VPGMH generated from an output terminal (hereinafter referred to as "node P") of the charge pump circuit 41 is supplied to the block decoder 25B. As the voltage VPGMH is higher than the voltage VPGM, that is, as the differential voltage ΔV generated by the voltage difference generation circuit 45 increases, the on-resistance of each of the transistors of the switch circuit group 25A can be further reduced. However, when the withstand voltage of the transistors of the switch circuit group 25A is taken into account, there is an upper limit on the differential voltage ΔV generated by the voltage difference generation circuit 45.

Figure 16:
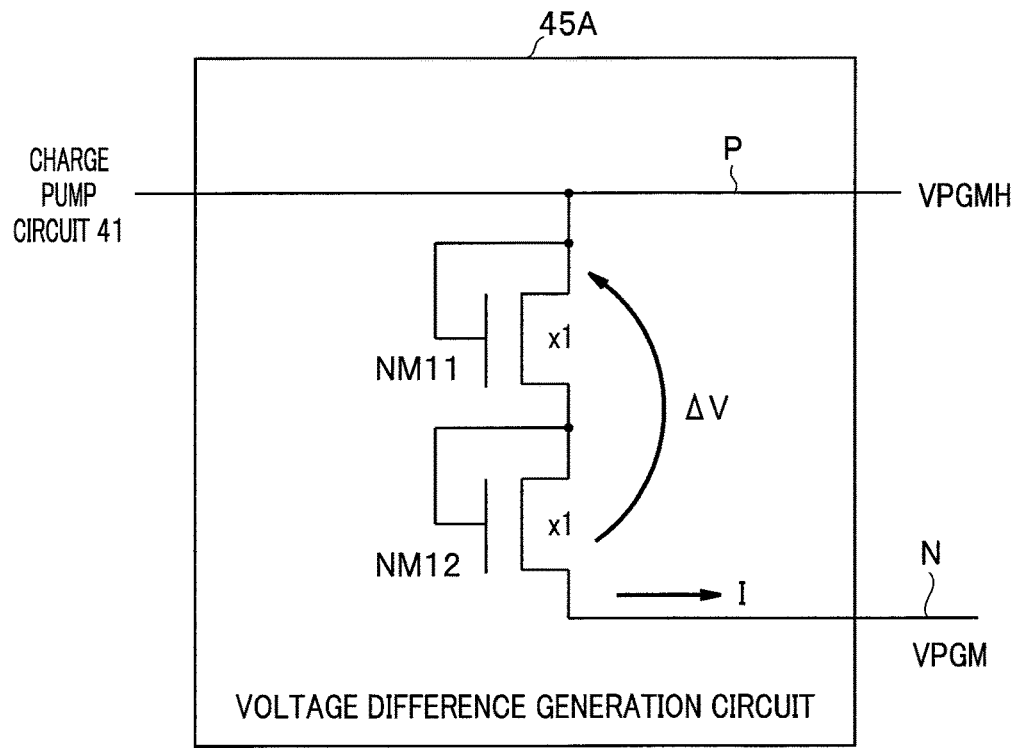
FIG. 16 is a circuit diagram showing a voltage difference generation circuit 45A which is a comparison example of a voltage difference generation circuit 45.

FIG. 16 is a circuit diagram showing a voltage difference generation circuit 45A which is a comparison example of the voltage difference generation circuit 45.

The voltage difference generation circuit 45A shown in FIG. 16 is formed of a two-stage diode-connected transistors. The current path of an NMOS transistor NM11 and the current path of an NMOS transistor NM12 are connected in series between the output node N and the node P at which the voltage VPGMH appears. The drain and the gate of the transistor NM11 are connected to the node P. The drain and the gate of the transistor NM12 are connected to the source of the transistor NM11, and the source of the transistor NM12 is connected to the output node N. In other words, the transistors NM11, NM12 are diode-connected, and a differential voltage ΔV is generated between the node P and the output node N based on the forward voltage of the transistors NM11, NM12. To sufficiently reduce the on-resistance of each transistor of the switch circuit group 25A, it is necessary to set the differential voltage ΔV to a sufficiently large value. For example, the diode-connected transistors are connected in two stages to acquire a differential voltage ΔV.

The differential voltage ΔV is decided by Vgs (gate-source voltage)–Id (drain current) characteristics of the diode-connected transistors NM11, NM12 and an electric current flowing through the diode-connected transistors NM11, NM12. The larger the drain current Id, the larger the differential voltage ΔV becomes. When a load on the memory cell array 23 side is large, a large electric current is supplied from the charge pump circuit 41 and, as a result, ΔV temporarily increases. For example, when a plurality of planes are driven by the voltage difference generation circuit 45A, a large electric current is supplied from the charge pump circuit 41 and, as a result, ΔV temporarily increases. For this reason, the voltage VPGMH at the node P becomes larger than necessary relative to the voltage VPGMH at the node N. Accordingly, there is a possibility of a relatively large voltage of more than the withstand voltage being applied to the gates of the transistors of the switch circuit group 25A.

To prevent such a situation, there is a method that increases the transistor sizes of the diode-connected transistors NM11, NM12. In a case where this method is adopted, a differential voltage ΔV can be set to a relatively small value even when a drain current Id increases and hence, it is possible to suppress a situation where the voltage VPGMH at the node P becomes larger than necessary relative to the voltage VPGMH at the node N. However, when this method is adopted, the areas of the diode-connected transistors NM11, NM12 increase, thus increasing the circuit area of the voltage generation circuit 28, ultimately leading to an increase in area of a chip forming the nonvolatile memory 2.

(Voltage Difference Generation Circuit)

In view of the above, the present embodiment adopts a configuration where the bypass current path is provided to the voltage difference generation circuit 45 in addition to the voltage difference generating current path, and the bypass current source is disposed on the bypass current path, the voltage difference generating current path being formed of the current paths of the diode-connected transistors, two voltages having a voltage difference being generated at both ends of the voltage difference generating current path.

In the specification, "transistor" indicates not only one physical transistor, but also a transistor formed of a plurality of transistors connected in parallel.

Figure 17:
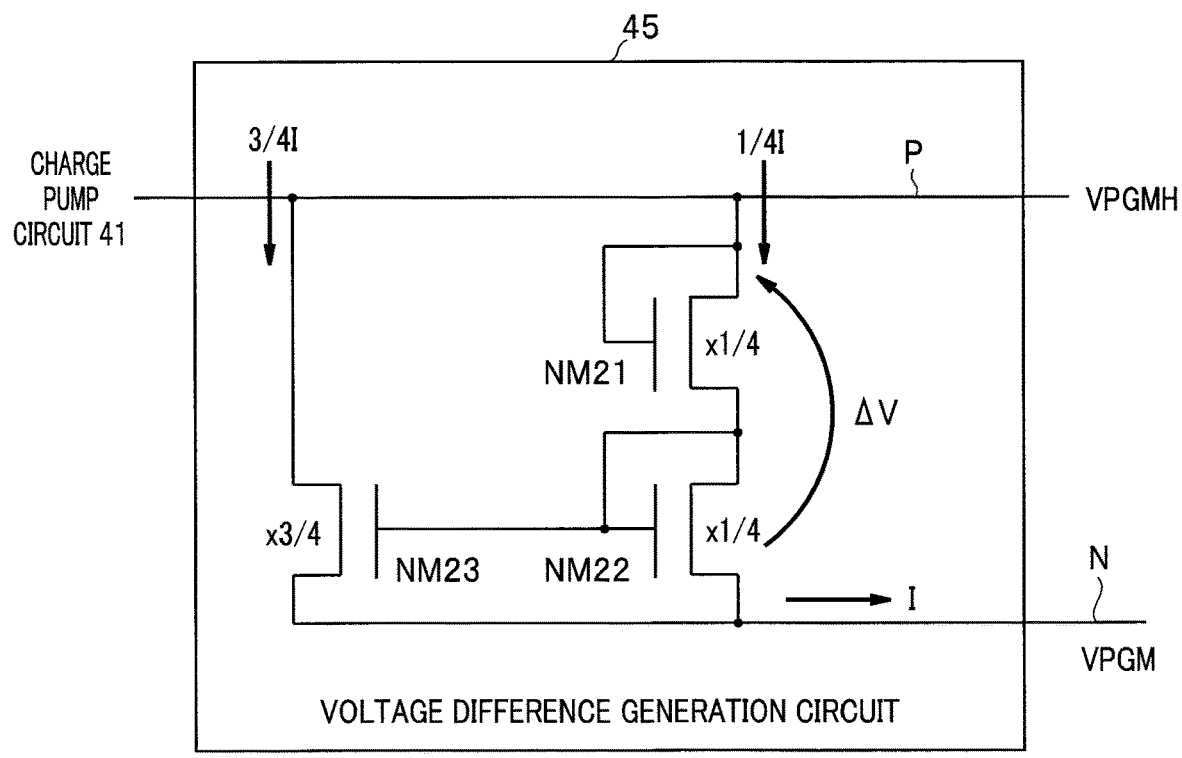
FIG. 17 is a circuit diagram showing one example of a specific configuration of the voltage difference generation circuit 45.

FIG. 17 is a circuit diagram showing one example of a specific configuration of the voltage difference generation circuit 45.

The output voltage VPGMH of the charge pump circuit 41 appears at the output terminal (the node P) of the charge pump circuit 41. The current path of an NMOS transistor NM21 and the current path of an NMOS transistor NM22 are connected in series between the node P and the output node N. The drain and the gate of the transistor NM21 is connected to the node P. The drain and the gate of the transistor NM22 are connected to the source of the transistor NM21, and the source of the transistor NM22 is connected to the output node N.

The voltage difference generating current path is formed of the current paths of the diode-connected transistors NM21, NM22. A differential voltage ΔV is generated between both ends of the voltage difference generating current path based on the forward voltage of the transistors NM21, NM22. The description has been made for an example where two transistors NM21, NM22 are provided in the voltage difference generating current path. However, it is sufficient to decide the number of transistors according to a differential voltage ΔV that should be generated, and one or three or more transistors may be used. The differential voltage ΔV is set to a value for which the withstand voltage of each transistor of the switch circuit group 25A is taken into account.

In the present embodiment, between the node P and the output node N, the bypass current path is provided in parallel to the voltage difference generating current path. The bypass current path is formed of the current path of an NMOS transistor NM23 having a drain connected to the node P, a source connected to the output node N, and a gate connected in common to the gate of the transistor NM22.

The gate-source voltage of the transistor NM23 matches the gate-source voltage of the transistor NM22. By operating the transistor NM23 in a saturation region, the current ratio between an electric current flowing through the current path of the transistor NM23 and an electric current flowing through the current path of the transistor NM22 substantially matches the ratio of transistor sizes between the transistors NM23, NM22. In other words, the transistor NM23 serves as the bypass current source, and sets the ratio between an electric current flowing through the bypass current path and an electric current flowing through the voltage difference generating current path to a predetermined fixed value.

FIG. 17 shows an example where the transistor size of the transistor NM23 is set to three times larger than the transistor size of the transistor NM22. As will be described later, the ratio of transistor sizes for the transistors NM21, NM22, NM23 may be suitably set. In the example shown in FIG. 17, assuming an electric current flowing through the output node N as "I", an electric current flowing through the bypass current path is 3×I/4, and an electric current flowing through the voltage difference generating current path is 1×I/4. In other words, in the example shown in FIG. 17, the current drivability of the transistor NM23 is three times greater than the current drivability of the transistor NM22 and hence, it is possible to set an electric current flowing through the voltage difference generating current path to ⅓ of an electric current flowing through the bypass current path.

The differential voltage ΔV increases or decreases according to the amount of electric current flowing through the voltage difference generating current path. However, in the present embodiment, even when an electric current I flowing through the output node N increases, it is possible to suppress an increase in amount of electric current flowing through the voltage difference generating current path and hence, it is possible to prevent the differential voltage ΔV from increasing more than necessary. Therefore, even when the electric current I flowing through the output node N increases, it is possible to prevent a situation where the voltage VPGMH increases, thus exceeding the withstand voltage of the transistor of the switch circuit group 25A.

Further, the area of the voltage difference generation circuit 45 can be set to be smaller than the area of the voltage difference generation circuit 45A shown in FIG. 16. Assume that the transistor size of each of the transistors NM11, NM12 of the voltage difference generation circuit 45A, that is, the gate width of each of the transistors NM11, NM12 is 1 W. In this case, assume that an electric current flowing through the output node N is I, and a differential voltage ΔV is generated between the node P and the output node N.

In the voltage difference generation circuit 45 of the present embodiment, assume that characteristics of the transistors NM21, NM22 are equal to the characteristics of the transistors NM11, NM12. An electric current of I/4 flows through the current paths of the transistors NM21, NN22. Accordingly, in a case where the gate width of each of the transistors NM21, NM22 is W/4, a differential voltage ΔV is generated between the node P and the output node N. The gate width of the transistor NM23 is 3 W/4 and hence, the total of the gate widths of the transistors NM21 to NM23 forming the voltage difference generation circuit 45 is {(¼)+(¼)+(¾)}W=5 W/4.

Accordingly, the ratio (size ratio) between the total of the gate widths of the transistors NM21, NM22, NM23 of the voltage difference generation circuit 45 of the present embodiment and the total of the gate widths of the transistors NM11, NM12 of the voltage difference generation circuit 45A is (5 W/4):(2 W)=⅝=0.625. As described above, by adopting the voltage difference generation circuit 45 shown in FIG. 17, it is possible to reduce the area to 62.5% compared with the area of the voltage difference generation circuit 45A without changing the differential voltage ΔV and without lowering the current drivability.

The drain voltage of the transistor NM22 slightly differs from the drain voltage of the transistor NM23, and the ratio between the electric current flowing through the voltage difference generating current path and the electric current flowing through the bypass current path does not accurately match the ratio between the gate width of the transistor NM22 and the gate width of the transistor NM23. To cause the ratio between the electric current flowing through the voltage difference generating current path and the electric current flowing through the bypass current path to accurately match the ratio between the gate width of the transistor NM22 and the gate width of the transistor NM23, it is sufficient to provide a diode-connected transistor (hereinafter referred to as "cascode transistor") having the same configuration as the transistor NM23 on the bypass current path between the node P and drain of the transistor NM23.

However, the dependence of the electric current flowing through the bypass current path on the drain voltage is relatively low. Even with the configuration of the voltage difference generation circuit 45 shown in FIG. 17, the ratio between the electric current flowing through the voltage difference generating current path and the electric current flowing through the bypass current path substantially matches the size ratio between the transistors NM22, NM23. Further, even when the ratio between the electric current flowing through the voltage difference generating current path and the electric current flowing through the bypass current path does not strictly match the size ratio between the transistors NM22, NM23, the voltage difference generation circuit 45 can prevent an excessive increase in the voltage VPGMH while setting the voltage VPGMH to a value sufficiently larger than the voltage VPGM. In other words, in the present embodiment, attention is given to the function of the voltage difference generation circuit 45 in the nonvolatile memory 2, and it is found that the cascode transistor can be omitted. In the present embodiment, an excessive increase in differential voltage ΔV is suppressed while the area of the voltage difference generation circuit 45 is reduced by a corresponding amount.

In a case where manufacturing variations in transistors and the bypass current source can be ignored, it is possible to set the ratio between the gate width of the transistor NM23 and the gate widths of the transistors NM21, NM22 to an extremely large value. In this case, the areas of the transistors NM21, NM22 can be ignored compared with the area of the transistor NM23. Accordingly, by adopting the voltage difference generation circuit 45 in the present embodiment, it is possible to reduce an area to 50% compared with the area of the voltage difference generation circuit 45A.

To adjust a differential voltage ΔV, a plurality of diode-connected transistors may be adopted for the current path of the transistor NM21, the plurality of diode-connected transistors having current paths connected in parallel. In this case, each of the plurality of transistors connected in parallel can be formed with a gate width substantially equal to the gate width of the transistor NM21 and hence, it is possible to obtain an extremely large effect in reducing area.

(Transistor Size Ratio)

The description has been made for the example shown in FIG. 17 where the ratio between the size of the transistor NM23 forming the bypass current source and the size of the transistor NM22 that generates differential voltage ΔV is set to ¾:¼. However, it is sufficient to set the size ratio to satisfy (size of transistor NM23 forming bypass current source)>(size of transistor NM22 that generates differential voltage ΔV), and it is possible to adopt any of various size ratios, such as ⅞:⅛ or ¹⁵⁄₁₆:¹⁄₁₆. Assuming that the transistor size ratio for the transistors NM21, NM22, NM23 is ⅛:⅛:⅞, for example, the total of the gate widths of the transistors NM21 to NM23 is {(⅛)+(⅛)+(⅞)}W=9 W/8.

It is not always necessary to set the transistor size of the transistor NM21 to be equal to the transistor size of the transistor NM22. For example, the ratio of the transistor sizes between the transistors NM21, NM22 may be set to ²⁄₄:¼. Provided that a differential voltage ΔV can be set to an appropriate value, as the transistor size of the transistor NM22 is further reduced compared with the transistor size of the transistor NM21, the current ratio between the voltage difference generating current path and the bypass current path can be further increased, so that it is possible to obtain a larger effect in reducing area.

Assuming that the transistor size ratio for the transistors NM21, NM22, NM23 is ⅛:¼:¾, for example, the size of the cascode transistor omitted in the above-mentioned bypass current path is ¾. In the same manner, assuming that the transistor size ratio for the transistors NM21, NM22, NM23 is ⅛:⅛:⅞, for example, the size of the cascode transistor omitted in the above-mentioned bypass current path is ⅞. Assuming that the transistor size ratio for the transistors NM21, NM22, NM23 is ⁴⁄₈:⅛:⅞, for example, the size of the cascode transistor omitted in the above-mentioned bypass current path is 28/8. In other words, as the transistor size of the transistor NM22 is further reduced compared with the transistor size of the transistor NM21, it is possible to further increase the current ratio between the voltage difference generating current path and the bypass current path while the current drivability of the entire voltage difference generation circuit 45 is maintained, so that it is possible to obtain a larger effect in reducing area by omitting the cascode transistor.

(Operation)

Next, operation of the embodiment having such a configuration will be described.

During the program period, the sequencer 27 performs control such that the program voltage VPGM is applied to selected word lines and the voltage VPASS that causes respective memory cells to conduct is applied to non-selected word lines. By applying the reference voltage VREF to the VPGM generation circuit 40 in the voltage generation circuit 28, the sequencer 27 sets the voltage VPGM that appears at the output node N to a desired voltage. In other words, the operation of the clock control circuit 42 is controlled based on an output from the comparator 44, so that the output voltage VPGMH of the charge pump circuit 41 changes. A voltage lowered by the voltage difference generation circuit 45 from the voltage VPGMH by the differential voltage ΔV appears at the output node N as the voltage VPGM.

When the voltage VPGM that appears at the output node N increases or decreases from the specified program voltage VPGM, the voltage at the connection point between the resistors R1, R2 increases or decreases to a value higher than or lower than the reference voltage VREF. As a result, the output voltage of the charge pump circuit 41 decreases or increases, so that the voltage at the output node N is maintained at the specified program voltage VPGM. In the feedback control of the voltage VPGM, the voltage VPGMH from the charge pump circuit 41 is fixed to voltage VPGM+ differential voltage ΔV by the voltage difference generation circuit 45.

As shown in FIG. 11, the sequencer 27 increases the voltage VPGM for each program loop in a stepwise manner. Also in this case, the current ratio between the electric current flowing through the bypass current path and the electric current flowing through the voltage difference generating current path does not change, and the voltage VPGMH is always maintained at a voltage higher than the voltage VPGM by the differential voltage ΔV. In other words, it is possible to reduce the electric current flowing through the voltage difference generating current path compared with the electric current I flowing through the output node N. Accordingly, an excessive increase in differential voltage ΔV is prevented and hence, there is no possibility that the voltage VPGMH exceeding the withstand voltage is applied to the transistors of the switch circuit group 25A.

By focusing on a fact that the dependence of the electric current flowing through the transistor NM23, which forms the bypass current source, on the drain voltage is relatively low, the cascode transistor substantially equal to the transistor NM23 is not provided on the bypass current path. Accordingly, the voltage difference generation circuit 45 can reduce an area compared with the voltage difference generation circuit 45A shown in FIG. 16 where diode-connected transistors NM11, NM12 in two stages are used.

As described above, in the present embodiment, by providing the bypass current path for reducing an electric current flowing through the voltage difference generating current path, a circuit area can be reduced while an increase in differential voltage ΔV is suppressed.

(Second Embodiment)

Figure 18:
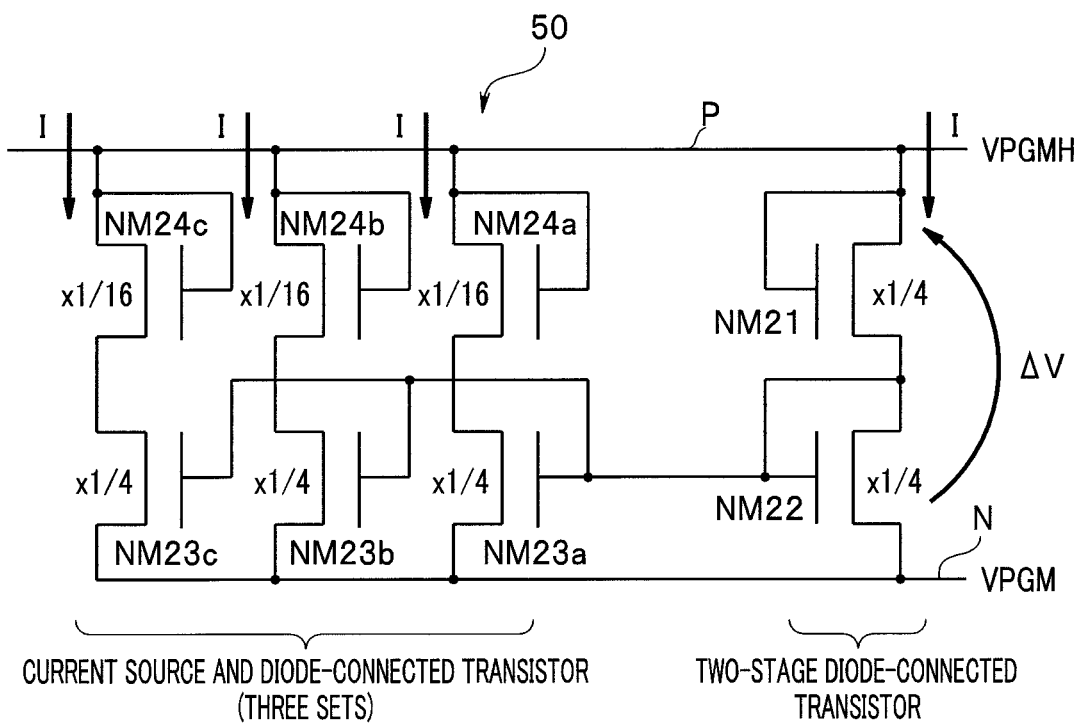
FIG. 18 is circuit diagram showing a voltage difference generation circuit 50 adopted in a second embodiment of the present invention.

FIG. 18 is a circuit diagram showing a voltage difference generation circuit 50 adopted in a second embodiment of the present invention. In FIG. 18, components identical to the corresponding components in FIG. 17 are given the same reference symbols, and the description of such components will be omitted.

The voltage difference generation circuit 50 differs from the voltage difference generation circuit 45 shown in FIG. 17 with respect to a point that NMOS transistors NM23a, NM23b, NM23c are provided in place of the transistor NM23 and NMOS transistors NM24a, NM24b, NM24c are adopted. Any of the NMOS transistors NM23a, NM23b, NM23c has characteristics substantially equal to characteristics of the transistor NM23, and the gate width of any of the NMOS transistors NM23a, NM23b, NM23c is ⅓ of the gate width of the transistor NM23. Accordingly, when the transistors NM24a to NM24c are removed from FIG. 18, it is possible to acquire a circuit substantially equal to the voltage difference generation circuit 45 shown in FIG. 17.

The current path of the transistor NM24a and the current path of the transistor NM23a are connected in series between the node P and the output node N. The drain and the gate of the transistor NM24a are connected to the node P, and the source of the transistor NM24a is connected to the drain of the transistor NM23a. The gate of the transistor NM23a is connected in common to the gate of the transistor NM22, and the source of the transistor NM23a is connected to the output node N.

In the same manner, the current path of the transistor NM24b and the current path of the transistor NM23b are connected in series between the node P and the output node N. The drain and the gate of the transistor NM24b are connected to the node P, and the source of the transistor NM24b is connected to the drain of the transistor NM23b. The gate of the transistor NM23b is connected in common to the gate of the transistor NM22, and the source of the transistor NM23b is connected to the output node N.

The current path of the transistor NM24c and the current path of the transistor NM23c are connected in series between the node P and the output node N. The drain and the gate of the transistor NM24c are connected to the node P, and the source of the transistor NM24c is connected to the drain of the transistor NM23c. The gate of the transistor NM23c is connected in common to the gate of the transistor NM22, and the source of the transistor NM23c is connected to the output node N.

The circuit shown in FIG. 18 is a circuit obtained by adding the transistors NM24a to NM24c as the cascode transistor omitted in the circuit shown in FIG. 17, each of the transistors NM24a to NM24c having a transistor size smaller than necessary for accurately maintaining the current ratio. Assuming that the transistor size of each of the transistors NM11, NM12 in the comparison example shown in FIG. 16 is 1 and the transistor size of each of the transistors NM21, NM22, NM23a to NM23c is ¼, the transistor size of each of the transistors NM24a to NM24c is set to ¹⁄₁₆, for example. The ratio of transistor sizes for the transistors NM24a to NM24c necessary for accurately maintaining the current ratio is ¼.

In the embodiment having such a configuration, a difference between the drain voltage of the transistors NM23a to NM23c and the drain voltage of the transistor NM22 is relatively small and hence, it is possible to more accurately control the current ratio between the electric current flowing through the voltage difference generating current path and the electric current flowing through the bypass current path.

Further, the drain voltage of the transistors NM23a to NM23c forming the bypass current source is lowered compared with a case where the transistors NM24a to NM24c are omitted and hence, there is an advantage that conditions of the withstand voltage of the transistors NM23a to NM23c can be relaxed.

By operating the transistors NM23a to NM23c in the saturation region, the transistors NM23a to NM23c serve as the current source. Therefore, it is necessary to operate the transistors NM23a to NM23c in the saturation region by increasing the drain-source voltage of the transistors NM23a to NM23c to a value higher than a pinch-off voltage. In other words, it is sufficient to decide a lower limit of the transistor size of the cascode transistor on the bypass current path based on the drain voltage of the transistors NM23a to NM23c that is used for maintaining the operation in the saturation region.

As described above, in the present embodiment, the cascode transistor is provided on the bypass current path, and the size ratio between the transistor forming the bypass current source and the cascode transistor is set to be smaller than the size ratio between the two transistors NM22, NM21 on the voltage difference generating current path. With such a configuration, it is possible to obtain the advantage that a differential voltage $\Delta V$ can be accurately generated by more accurately controlling the current ratio while an increase in area of the voltage difference generation circuit is suppressed, and conditions of the withstand voltage of the transistors forming the bypass current source can be relaxed.

(Third Embodiment)

Figure 19:
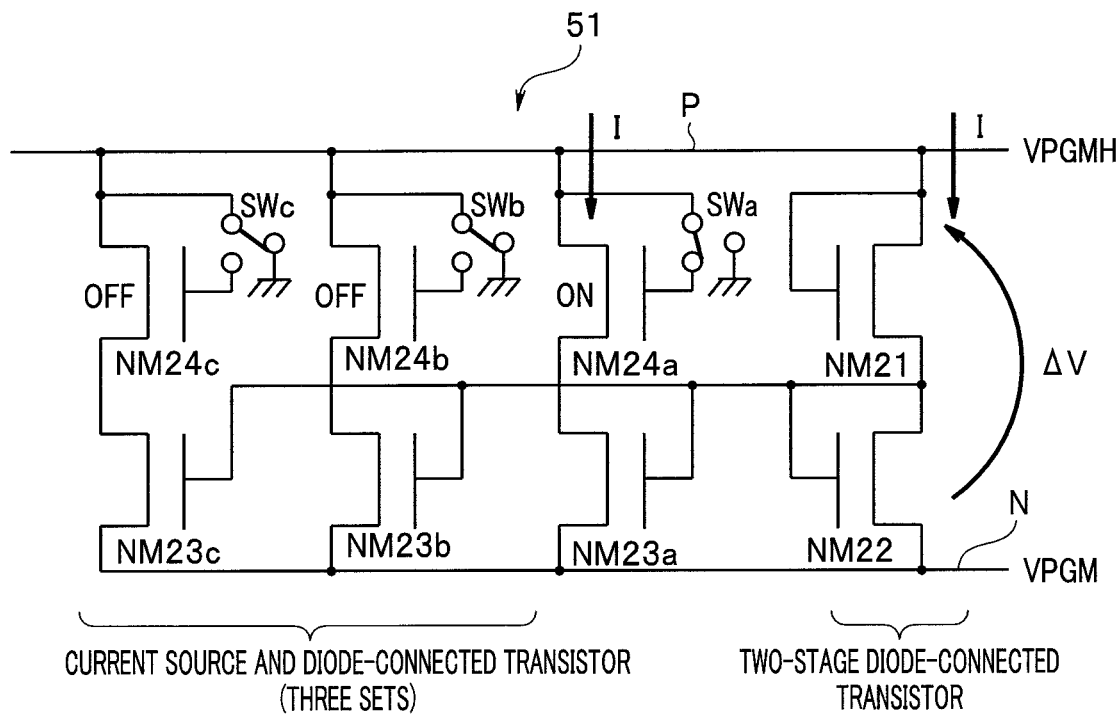
FIG. 19 is a circuit diagram showing a voltage difference generation circuit 51 adopted in a third embodiment of the present invention.
Figure 20:
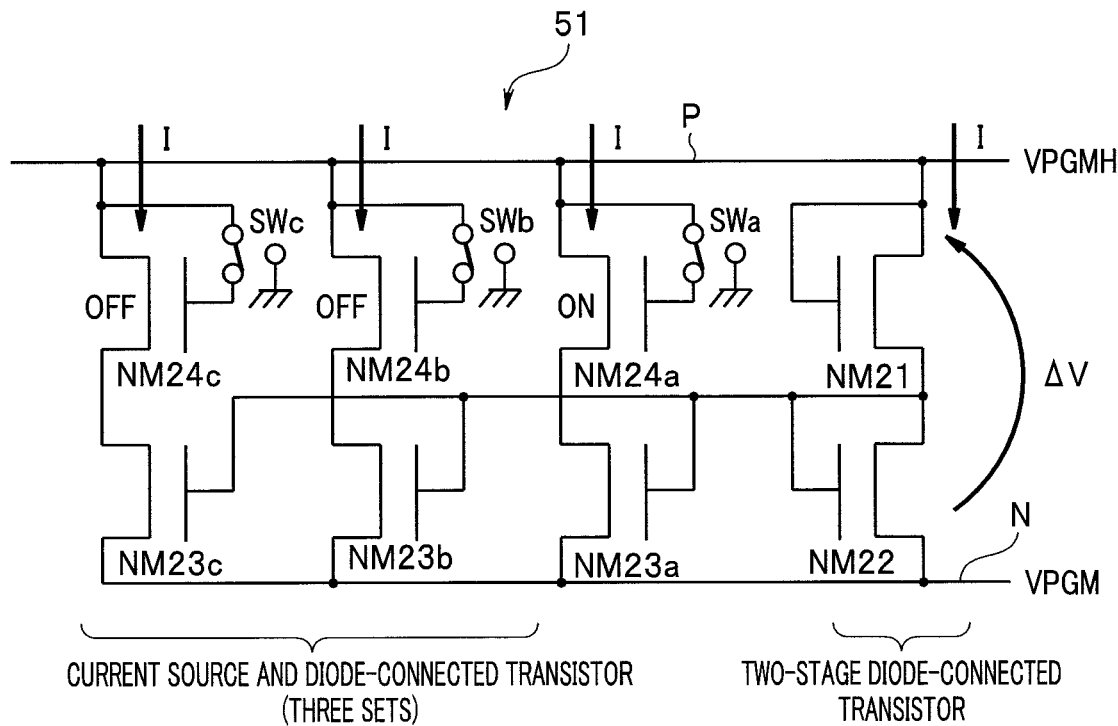
FIG. 20 is a circuit diagram showing the voltage difference generation circuit 51 adopted in the third embodiment of the present invention.

FIG. 19 and FIG. 20 are circuit diagrams showing a voltage difference generation circuit 51 adopted in a third embodiment of the present invention. In FIG. 19 and FIG. 20, components identical to the corresponding components in FIG. 18 are given the same reference symbols, and the description of such components will be omitted.

The sequencer 27 can select a four-plane program or a two-plane program. In the four-plane program, the writing operation is simultaneously performed on four planes of the planes PB0 to PB3. In the two-plane program, the writing operation is simultaneously performed on two planes of the planes PB0 to PB3. In the VPGM generation circuit 40, the load capacity of the four-plane program is two times greater than the load capacity of the two-plane program. Accordingly, in the circuit shown in FIG. 18, an electric current flowing from the node P to the output node N during the four-plane program is two times greater than during the two-plane program. Therefore, in the circuit shown in FIG. 18, a differential voltage $\Delta V$ during the four-plane program is two times greater than a differential voltage $\Delta V$ during the two-plane program.

In view of the above, in the present embodiment, by allowing the adjustment of the number of bypass current paths according to a change in the amount of electric current outputted from the output node N of the voltage difference generation circuit, a change in electric current flowing through the voltage difference generating current path is suppressed to reduce variations in differential voltage $\Delta V$.

The voltage difference generation circuit 51 differs from the voltage difference generation circuit 50 shown in FIG. 18 with respect to a point that switches SWa to SWc are provided. The switch SWa changes over between a state where the node P is connected to the gate of the transistor NM24a (ON state) and a state where the node P is connected to the reference potential point (OFF state). The switch SWb changes over between a state where the node P is connected to the gate of the transistor NM24b (ON state) and a state where the node P is connected to the reference potential point (OFF state). The switch SWc changes over between a state where the node P is connected to the gate of the transistor NM24c (ON state) and a state where the node P is connected to the reference potential point (OFF state). Each of the switches SWa to SWc changes over between an ON state and an OFF state according to the control of the sequencer 27. In FIG. 19 and FIG. 20, three bypass current paths are shown. However, the number of bypass current paths is not limited to three.

Next, the operation in the embodiment having such a configuration will be described.

The sequencer 27 controls the switches SWa to SWc according to the number of planes in which writing is performed simultaneously. For example, during the two-plane program, as shown in FIG. 19, assume that the switches SWa, SWb are controlled to an OFF state and the switch SWc is controlled to an ON state. Assume that the size ratio for the respective transistors of the voltage difference generation circuit 51 is equal to the example of the size ratio for the respective transistors of the voltage difference generation circuit 50 shown in FIG. 18. In such a case, in a state shown in FIG. 19, the same electric current I flows through the voltage difference generating current path and the bypass current path, and an electric current 2I flows through the output node N.

Next, the sequencer 27 executes the four-plane program. In this case, as shown in FIG. 20, the sequencer 27 controls the switches SWa to SWc to an ON state. With such an operation, in this case, an electric current 4I flows through the output node N, and an electric current I flows through each of the bypass current paths and the voltage difference generating current path. The electric current I flows through the voltage difference generating current path in this manner regardless of a change in load capacity and hence, it is possible to acquire a constant differential voltage $\Delta V$.

Therefore, the on-resistances of the respective transistors of the switch circuit group 25A match between the two-plane program and the four-plane program and hence, the dependence of the on-resistance on the number of planes is reduced.

As described above, in the present embodiment, the number of bypass current paths can be adjusted according to a change in an amount of electric current to be outputted. The present embodiment can obtain advantageous effects substantially equal to the advantageous effects of the second embodiment, and a differential voltage $\Delta V$ can be made constant regardless of the amount of output current.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor storage device comprising:
   a block including a plurality of memory cells;
   a word line connected to gates of the plurality of memory cells;
   a plurality of bit lines connected respectively to one ends of the plurality of memory cells;
   a first wiring;
   a connection transistor configured to electrically connect the first wiring to the word line based on a signal supplied to a gate of the connection transistor;
   a block decoder configured to supply the signal to the gate of the connection transistor; and
   a voltage generation circuit including
      a first node from which a first voltage for generating the signal is supplied to the block decoder,
      a second node from which a second voltage is supplied to the first wiring, and
      a voltage difference generation circuit connected between the first node and the second node, wherein
   the voltage difference generation circuit includes
      a first transistor having
         a first terminal connected to the first node,
         a gate connected to the first node, and
         a second terminal,
      a second transistor having
         a first terminal connected to the second terminal of the first transistor,
         a gate connected to the second terminal of the first transistor, and
         a second terminal connected to the second node, and
      at least one third transistor each having
         a first terminal connected to the first node,
         a gate connected to the gate of the second transistor, and
         a second terminal connected to the second node, and
      the at least one third transistor, all together, has a current drivability greater than a current drivability of the second transistor.

2. The semiconductor storage device according to claim 1, wherein
   a current drivability of the first transistor is equal to or greater than a current drivability of the second transistor.

3. The semiconductor storage device according to claim 1, further comprising:
   at least one fourth transistor each having
      a first terminal connected to the first node,
      a gate connected to the first node, and
      a second terminal, wherein
   the first terminal of the at least one third transistor is connected to the first node via the at least one fourth transistor, and
   a ratio between a current drivability of the at least one fourth transistor and a current drivability of the at least one third transistor is less than a ratio between a current drivability of the first transistor and a current drivability of the second transistor.

4. The semiconductor storage device according to claim 3, wherein
   the at least one third transistor includes a plurality of third transistors,
   the at least one fourth transistor includes a plurality of fourth transistors,
   first terminals of the plurality of third transistors are respectively connected to second terminals of the plurality of fourth transistors, and
   the plurality of third transistors and the plurality of fourth transistors form a plurality of current paths between the first node and the second node.

5. The semiconductor storage device according to claim 4, comprising:
   a switch circuit configured to control conduction of each of the plurality of current paths, wherein
   the switch circuit controls the conduction of each of the plurality of current paths based on a load capacity connected to the second node.

6. The semiconductor storage device according to claim 1, further comprising:
- a first resistor connected between the second node and a third node;
- a second resistor connected between the third node and a fourth node;
- a comparator having a first input terminal connected to the third node and a second input terminal connected to a reference voltage;
- a clock control circuit into which a first signal is inputted from an output terminal of the comparator; and
- a charge pump circuit into which a second signal is inputted from an output terminal of the clock control circuit, an output terminal of the charge pump circuit being connected to the first node.

7. The semiconductor storage device according to claim 6, further comprising:
- a fifth transistor connected between the second node and the first resistor; and
- a sixth transistor connected between the second resistor and the fourth node, wherein the second resistor has a variable resistance.

* * * * *